United States Patent
Maruyama

(10) Patent No.: US 7,235,455 B2
(45) Date of Patent: Jun. 26, 2007

(54) METHOD OF ALIGNING AN ELECTRON BEAM APPARATUS AND SEMICONDUCTOR SUBSTRATE UTILIZING AN ALIGNMENT MARK

(75) Inventor: Takashi Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 226 days.

(21) Appl. No.: 11/061,469

(22) Filed: Feb. 22, 2005

(65) Prior Publication Data

US 2006/0103035 A1   May 18, 2006

(30) Foreign Application Priority Data

Nov. 16, 2004   (JP)   ............... 2004-332345

(51) Int. Cl.
*H01L 21/76* (2006.01)
*H01L 23/544* (2006.01)

(52) U.S. Cl. .................................... 438/401; 257/797
(58) Field of Classification Search ............... None
See application file for complete search history.

(56) References Cited

U.S. PATENT DOCUMENTS 6,762,111 B2 * 7/2004 Fukuda .................. 438/401
2004/0198018 A1* 10/2004 Fukuda .................. 438/401
2006/0072807 A1* 4/2006 Bultman et al. ........... 382/149

FOREIGN PATENT DOCUMENTS

JP           6-252025         9/1994

* cited by examiner

*Primary Examiner*—Alonzo Chambliss
(74) *Attorney, Agent, or Firm*—Westerman, Hattori, Daniels & Adrian, LLP.

(57) ABSTRACT

Disclosed are a semiconductor wafer, a semiconductor device, and a method of manufacturing the semiconductor device, which are capable of easily carrying out an alignment between a semiconductor substrate and an electron beam exposure apparatus. There is provided a method including steps of: forming an interlayer insulating film 25 on a gate electrode 17a and a conductive film 17, as well as in a first opening 17b; forming in the interlayer insulating film 25 a second opening 25a including the first opening 17b; forming a hole 14a in an element isolation insulating film 14 under the first opening 17b; by use of the first opening 17b and the hole 14a as an alignment mark 27 used for the alignment in a state where a resist 28 is applied, measuring an intensity of a reflected electron $EB_{ref}$ from the alignment mark 27, thus aligning the electron beam exposure apparatus with the semiconductor substrate 10; exposing with an electron beam EB the resist 28 existing in a hole formation region of a first region I; and developing the resist 28 to make a resist pattern 28e.

10 Claims, 25 Drawing Sheets

METHOD OF ALIGNING AN ELECTRON BEAM APPARATUS AND SEMICONDUCTOR SUBSTRATE UTILIZING AN ALIGNMENT MARK

CROSS-REFERENCE TO RELATED APPLICATIONS

This application is based on and claims priority of Japanese Patent Application No. 2004-332345 filed on Nov. 16, 2004, the entire contents of which are incorporated herein by reference.

BACKGROUND OF THE INVENTION

1. Field of the Invention

The present invention relates to a semiconductor wafer, a semiconductor device, and a method of manufacturing the semiconductor device.

2. Description of the Related Art

In order to manufacture a semiconductor device such as LSI, an exposure process for exposing photo resist is needed, but among many methods, an electron beam exposure which uses an electron beam is extremely effective for attaining the refining of semiconductor devices, because it has a high resolution characteristic.

However, in order to fully bring out such a high resolution characteristic, it is necessary to carry out the alignment accurately between an electron beam exposure apparatus and a semiconductor substrate prior to the electron beam exposure. A method of this alignment is described with reference to FIG. 1.

FIG. 1 is a view showing the principle of the method of aligning an electron beam exposure apparatus with a semiconductor substrate according to a prior art.

In this method, as shown in FIG. 1, a recess with a width W1 of approximately 2 im is formed as an alignment mark 1a in a semiconductor substrate 1, and by scanning an electron beam EB on the semiconductor substrate 1, the intensity of a reflected electron $EB_{ref}$ from the alignment mark 1a is measured by a detector 2.

The intensity of the reflected electron $EB_{ref}$ becomes a smaller value as the height of the surface of the semiconductor substrate 1 is lower. Consequently, as shown in the lower graph 8 of FIG. 1, the intensity of the reflected electron becomes lower in the alignment mark 1a as compared with the one in the flat face of the semiconductor substrate 1, and a valley which indicates the presence of the mark 1a appears in this graph 8. Accordingly, the position of the alignment mark 1a can be grasped by detecting a valley of the graph of the intensity of the reflected electron by the detector 2, and the alignment between the semiconductor substrate 1 and the electron beam exposure apparatus is carried out based on this position.

In addition, Patent Document 1 discloses strengthening the intensity of the reflected electron from the mark by forming metal inside the alignment mark by utilizing the fact that the intensity of the reflected electron becomes strong on the surface of metal.

[Patent Document 1]
Japanese Patent Laid-Open No. Hei 6(1994)-252025

SUMMARY OF THE INVENTION

Incidentally, in the prior art described with reference to FIG. 1, a recess formed directly in the semiconductor substrate 1 is employed as the alignment mark 1a. However, in the case where a film for devices, such as a conductive film for gate electrodes, is formed on the semiconductor substrate 1, the recess which is formed under this conductive film and which an electron beam does not reach cannot be used as the alignment mark. Therefore, in this case, the alignment mark is formed in the conductive film.

FIG. 2 is a view at the time when an electron beam exposure apparatus is aligned with a semiconductor substrate by forming the alignment mark in the conductive film in the above described manner. Note that, in this view, the same reference numerals as those of FIG. 1 are given to the same constituent components as those of FIG. 1.

As shown in FIG. 2, in this example, an opening 3a is formed as the alignment mark in a conductive film 3 which is to be the gate electrode afterward, and the intensity of the reflected electron generated by this opening 3a is measured. The position of the semiconductor substrate 1 is calculated based on this measurement result However, because the thickness of the conductive film 3 for the gate electrode is as thin as approximately 0.1 im at a maximum due to demands for refining the gate electrode and the like, the intensity of the reflected electron does not vary largely when the opening 3a is scanned with the electron beam. For this reason, as shown in the lower view of FIG. 2, because the S/N ratio of the graph 9 which indicates the intensity of the reflected electron becomes smaller, it is difficult to determine where the opening 3a exists, and thereby the alignment between the semiconductor substrate 1 and the electron beam exposure apparatus will be difficult. As far as the inventor of the present invention has investigated, it becomes apparent that the opening 3a is needed to have a height of at least approximately 0.3 im in order to form a distinct valley in the intensity of the reflected electron. However, the formation of such a conductive film 3 having a thick thickness makes it impossible to form refined gate electrodes.

According to one aspect of the present invention, there is provided a semiconductor wafer that includes: a semiconductor substrate; an element isolation insulating film formed in a first region of the semiconductor substrate, the element isolation insulating film having a hole; an conductive film formed on the element isolation insulating film, the conductive film having a first opening on the hole; and an interlayer insulating film formed on the conductive film, the interlayer insulating film having a second opening with a size to encompasses the first opening.

According to another aspect of the present invention, there is provided a semiconductor device that includes: a semiconductor substrate; an element isolation insulating film formed in a first region of the semiconductor substrate, the element isolation insulating film having a hole; a conductive film formed on the element isolation insulating film, the conductive film having a first opening on the hole; a gate electrode formed in a second region of the semiconductor substrate with a gate insulating film interposed therebetween, the gate electrode being made of the same material as that of the conductive film; a source/drain region formed in the semiconductor substrate beside the gate electrode; an interlayer insulating film formed on the conductive film and on the gate electrode, the interlayer insulating film having, in the first region, a second opening with a size to encompass the first opening and having, in the second region, a hole with a depth reaching the source/drain region; and a conductive plug formed in the hole, the conductive plug being electrically connected to the source/drain region.

Furthermore, according to another aspect of the present invention, there is provided a method of manufacturing a semiconductor device that includes the steps of: forming an element isolation insulating film in a first region of a semiconductor substrate; forming a gate insulating film in a second region of the semiconductor substrate; forming a conductive film on the gate insulating film and on the element isolation insulating film; forming a first opening in the conductive film of the first region; patterning the conductive film of the second region to make the conductive film into a gate electrode; forming a source/drain region in the semiconductor substrate beside the gate electrode; forming an interlayer insulating film on each of the gate electrode and the conductive film as well as in the first opening; forming a second opening with a size to encompass the first opening in the interlayer insulating film of the second region; forming a hole in the element isolation insulating film under the first opening; applying resist onto the interlayer insulating film, and in the first and the second openings as well as in the hole: aligning the electron beam exposure apparatus with the semiconductor substrate under the state where the resist is applied, while using the first opening and the hole as an alignment mark, by scanning the mark with a electron beam of the electron beam exposure apparatus through the second opening and measuring an intensity of a reflected electron beam from the mark; exposing the resist existing in a hole formation region of the first region with an electron beam using the electron beam exposure apparatus after carrying out the alignment; developing the resist to make a resist pattern after the exposure; and forming in the interlayer insulating film a hole with a depth reaching the source/drain region by etching the interlayer insulating film by use of the resist pattern as a mask.

According to the present invention, prior to exposing the resist with the electron beam, the alignment between the electron beam exposure apparatus and the semiconductor substrate is carried out by using the hole of the element isolating insulation film and the first opening of the conductive film as the alignment mark and by scanning this mark with the electron beam to measure the intensity of the reflected electron. Because this mark is constituted by not only the first opening of the conductive film but the hole of the element isolating insulation film thereunder, the depth of the mark becomes deeper than the case where only the first opening is used as the mark. Since the intensity of the reflected electron varies largely due to such a deep mark when the mark is scanned with the electron beam, the position of the mark can easily be determined in the present invention, and even if the underlying layer of the resist is a thin conductive film for gate electrode, the alignment between the semiconductor substrate and the electron beam exposure apparatus can be carried out with high precision.

The method of arranging the first region where the mark is formed and the second region where the gate electrode is formed is not limited in particular. For example, a chip region of the semiconductor substrate may be employed as the second region, and a region included in a scribe region of this semiconductor substrate may be employed as the first region.

In such a case, the first region may be provided at the four corners of the outside of the chip region, and by scanning the marks of these four corners individually with the electron beam, the positional misalignment of each chip region can be grasped with high precision.

Alternatively, the chip region of a semiconductor substrate may be employed as the second region, and the region included in this chip region may be employed as the first region. If doing this way, the distance between each point inside the chip region and the first region will be shorter as compared with the case where the first region is present outside the chip region. The positional misalignment of the chip region can be therefore corrected with higher precision by scanning the mark formed in the first region with the electron beam.

DETAILED DESCRIPTION OF THE PREFERRED EMBODIMENT

Then, embodiments of the present invention will be described in detail with reference to the accompanying drawings.

(1) First Embodiment

Figure 1:
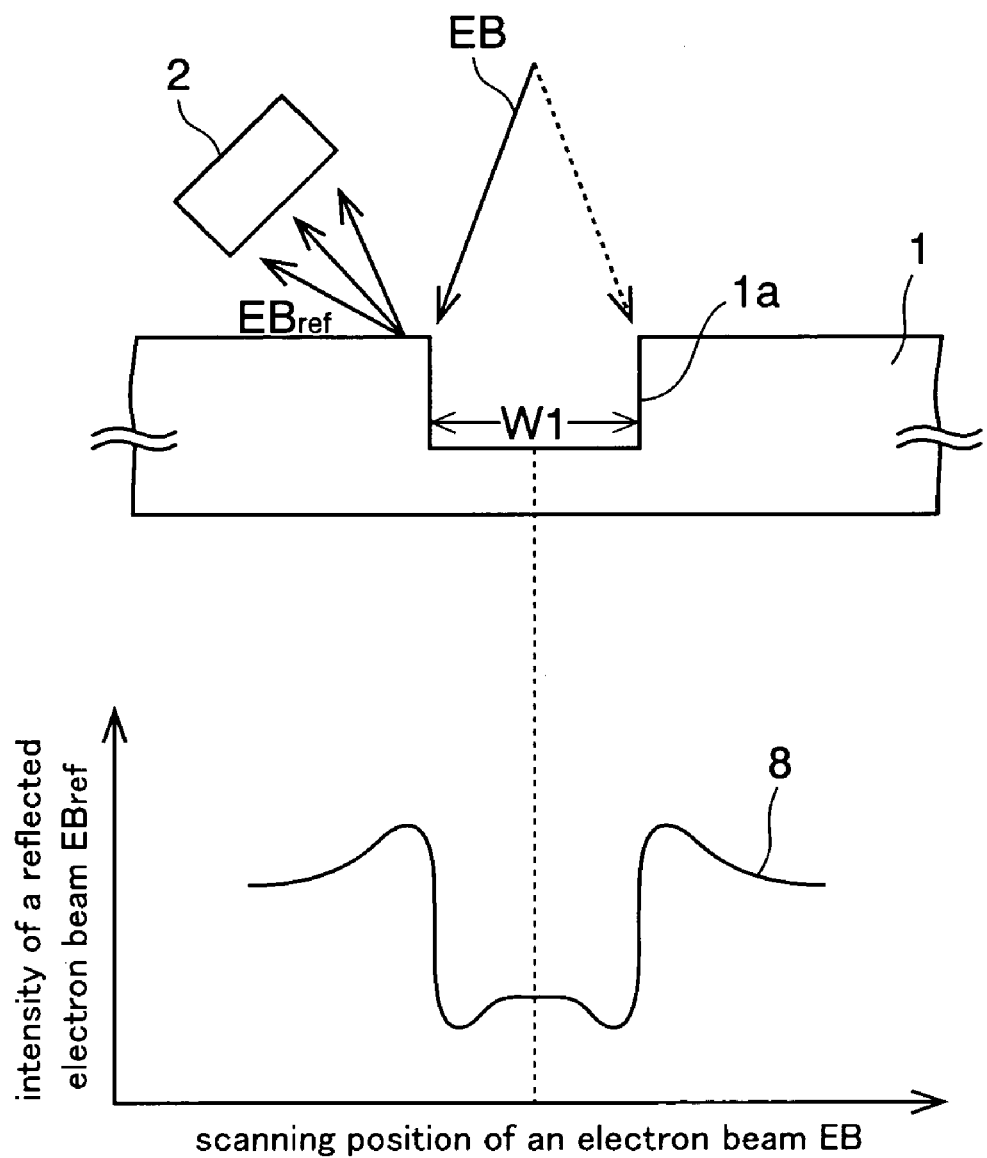
FIG. 1 is a view showing the principle of a method of aligning an electron beam exposure apparatus with a semiconductor substrate according to a prior art.
Figure 2:
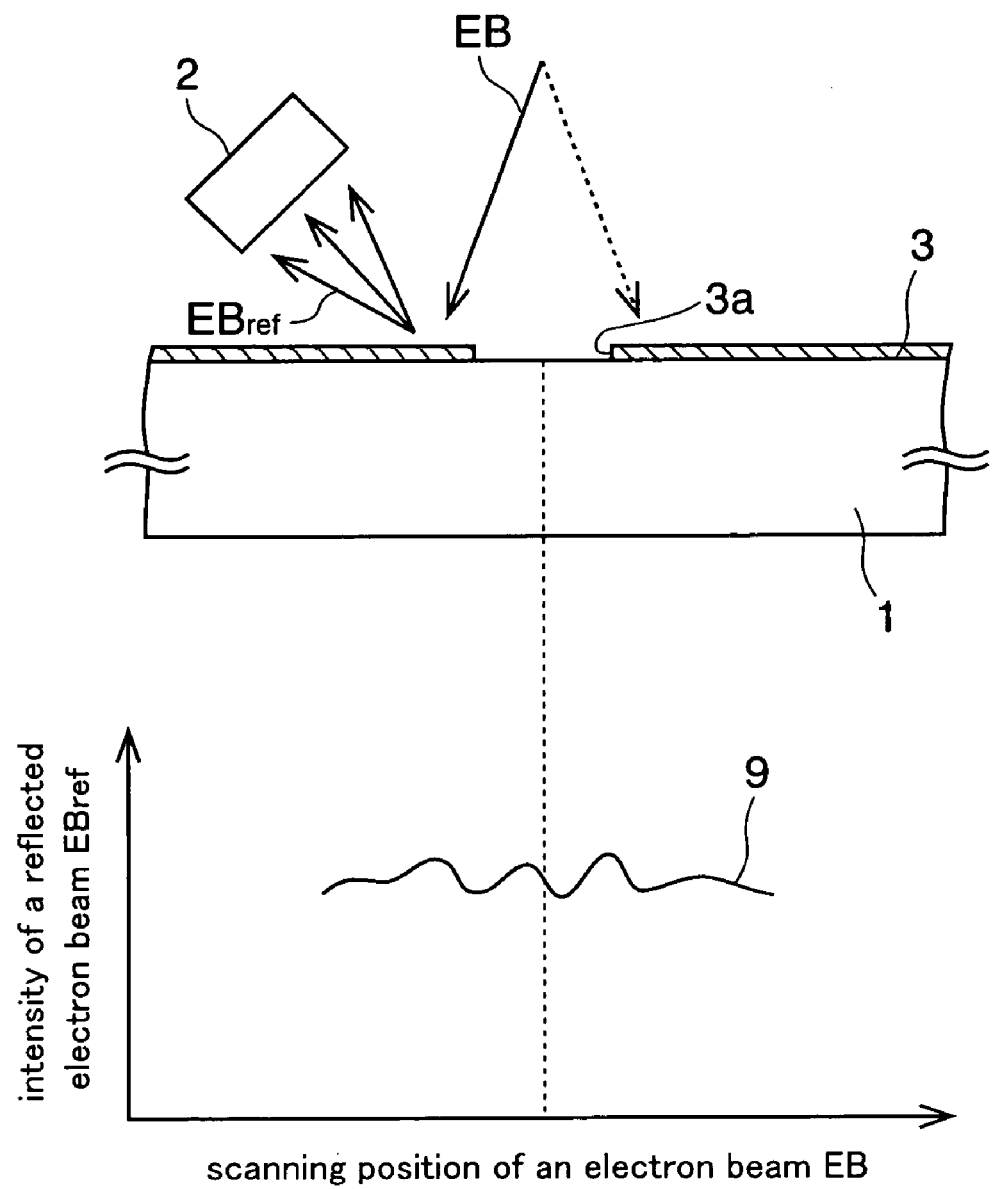
FIG. 2 is a view at the time when an alignment of an electron beam exposure apparatus with a semiconductor substrate is carried out by forming an alignment mark in an electric conduction film in the prior art.
Figure 3:
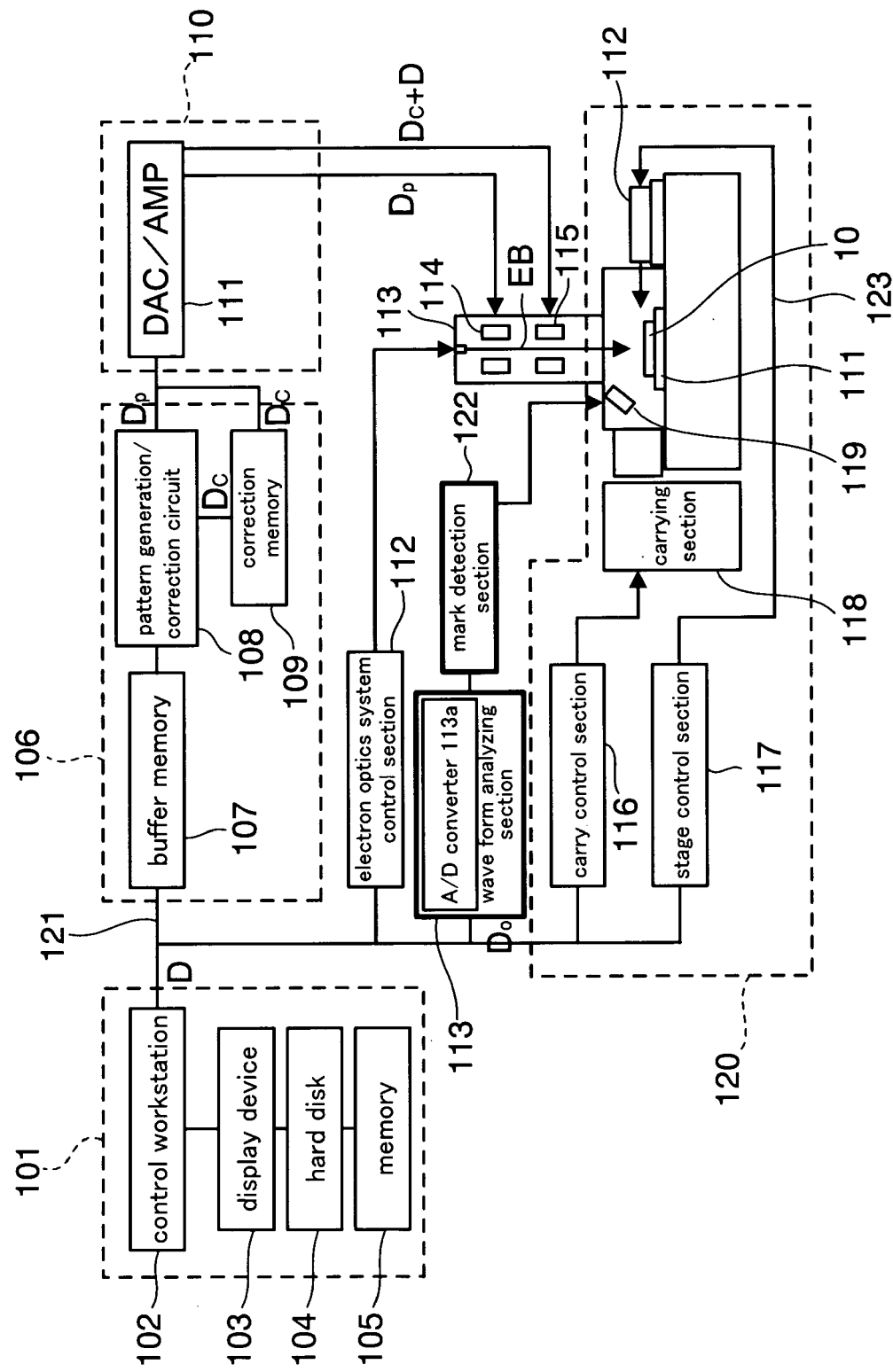
FIG. 3 is a block diagram of an electron beam exposure apparatus used in a first embodiment according to the present invention.

FIG. 3 is a block diagram of an electron beam exposure apparatus used in this embodiment.

This exposure apparatus includes an overall control system 101, a digital control system 106, an analog circuit 110, a machinery system 120, and an electron optics system column 113, and carries out exposure to a silicon substrate 10 inside the electron optics system column 113.

The overall control system 101 includes a control workstation 102, a display device 103 attached to this workstation, a hard disk 104, and a memory 105, and transmits/receives data to/from a digital control system 106 and the machinery system 120 via a bus 121. Such data includes, for example, a deflection data D which is generated by the control workstation 102 and determines the amount of deflection of the electron beam, which will be described hereinafter. This deflection data D is generated by the control workstation 102 depending on the shape and the size of device patterns such as a gate electrode.

However, because there is usually a positional misalignment between the semiconductor substrate 10 and the electron beam exposure apparatus, if the deflection data D is used solely without correcting the deflection data D, the electron beam will be irradiated with a deviation from the target position, for example, the position where the gate electrode is to be formed. A deflection correcting data is therefore required, which will be described hereinafter.

On the other hand, the digital control system 106 includes a buffer memory 107 which stores the data inputted from the bus 121 temporarily. Moreover, in the subsequent stage of this buffer memory 107, a pattern generation/correction circuit 108 is provided, which generates the pattern shape of the electron beam at the time when the alignment mark on the substrate 10 is scanned, and a pattern data $D_p$ corresponding to this pattern shape is outputted from the circuit 108.

Furthermore, this pattern generation/correction circuit 108 has also a function which generates a deflection correcting data $D_c$ for the electron beam EB based on the position data of the alignment mark obtained by scanning the alignment mark. Then, an electron beam is irradiated to the target position using the sum of this deflection correcting data $D_c$ and the above described deflection data D as the deflection data after the correction. In addition, the above described deflection correcting data $D_c$ is stored in a correction memory 109.

Moreover, the analog circuit 110 is provided with DAC/AMP 111 which digital-to-analog converts the above described digital data $D_p$, $D_c$, and D, and amplifies the analog data after the conversion.

On the other hand, the machinery system 120 includes a carrying section 118 which carries the substrate 10 automatically into the electron optics system column 113, and an X-Y stage 111 in which the carried substrate 10 is placed. This X-Y stage 111 has a structure to be vibration-isolated by a vibration isolating device 123. Then, a carry control section 116 and a stage control section 117, which control each of the carrying section 118 and the X-Y stage 111, are provided in the machinery system 120.

Moreover, above the X-Y stage 111, a detector 119 such as a PIN diode, which receives the reflected electron reflected by the alignment mark of the substrate 10, is arranged. Then, a voltage signal outputted from the detector 119 is amplified in a mark detection section 122, and is thereafter converted to a digital value in an A/D converter 113a Based on this digital value, a waveform analyzing section 113 determines the position of the alignment mark.

The electron optics system column 113 includes a size-adjusting deflector 114 to which the pattern data $D_p$ which has been subjected to the analog conversion is inputted, and the plan size of the electron beam EB is adjusted by the deflector 114. Furthermore, a position deflector 115 to which the pattern data $D_c$ which has been subjected to the analog conversion is inputted is arranged inside the column 113. The deflection position of the electron beam EB is adjusted by this deflector 115.

Then, the acceleration energy and the like of the electron beam EB in the electron optics system column 113 is adjusted by an electron optics system control section 112.

In this embodiment, a semiconductor device is manufactured using the above described electron beam exposure apparatus as follows.

Figure 4:
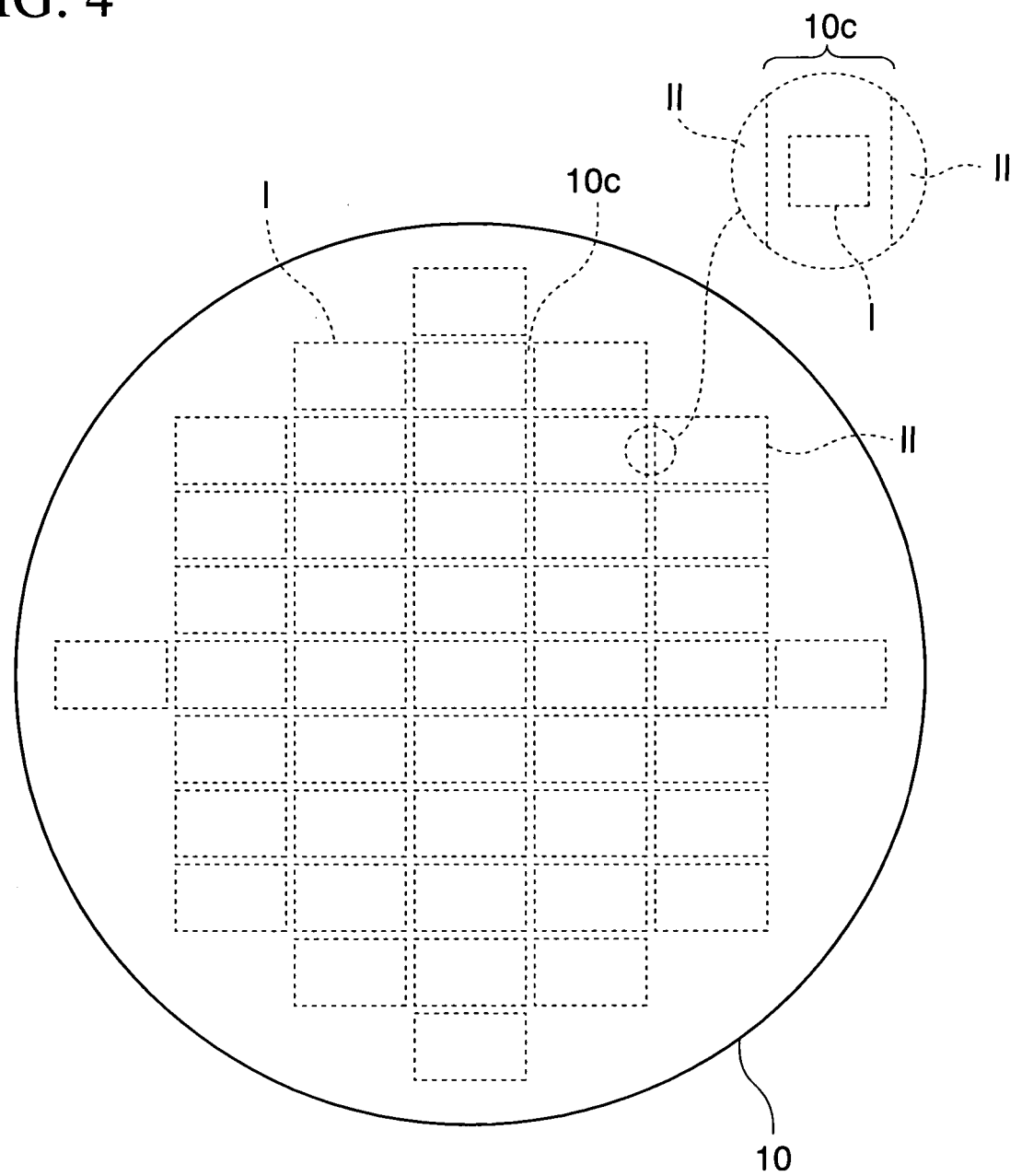
FIG. 4 is a plan view of a silicon substrate used in the first embodiment according to the present invention.
Figure 5A:
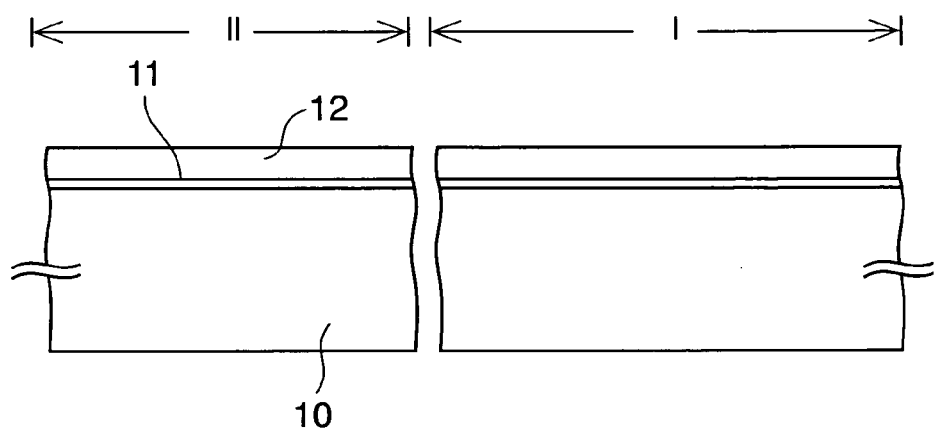
FIGS. 5A to 5Q are cross sectional views in the course of manufacturing a semiconductor device according to the first embodiment of the present invention.
Figure 5B:
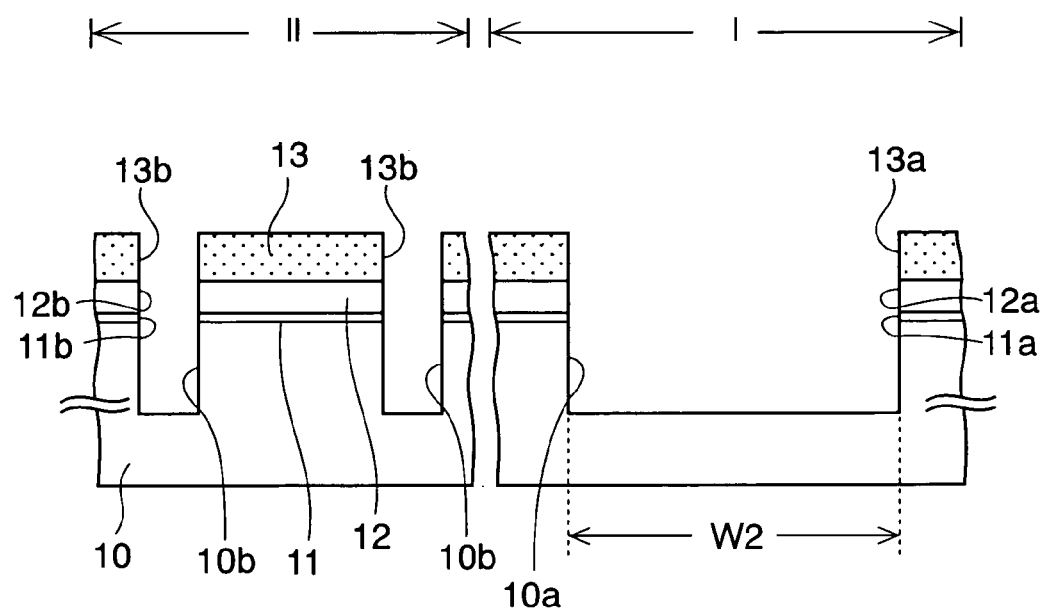
Figure 5C:
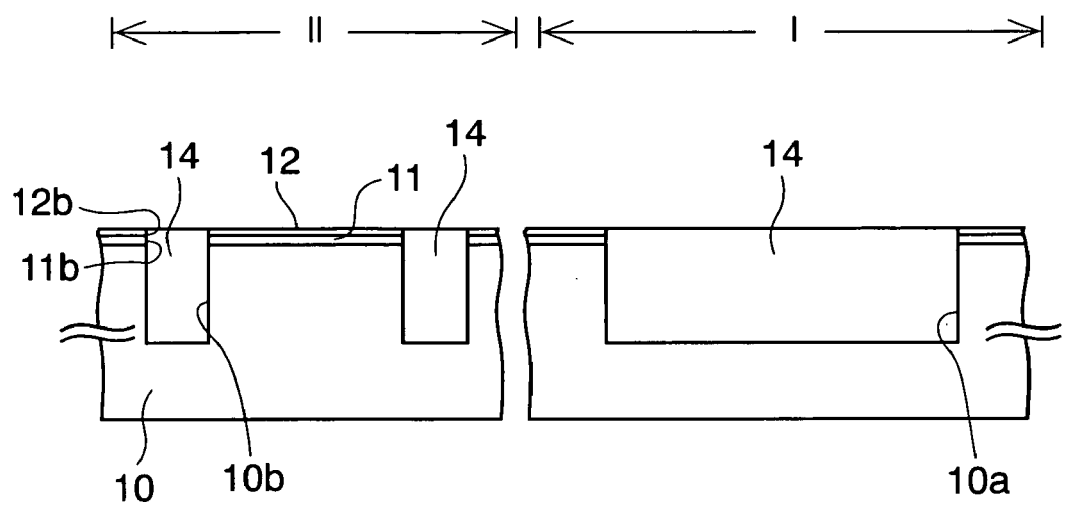
Figure 5D:
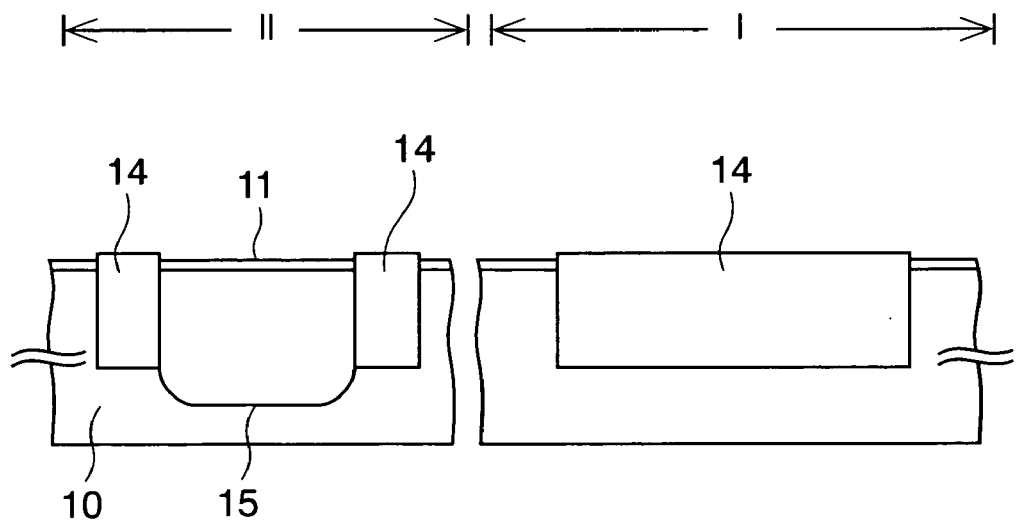
Figure 5E:
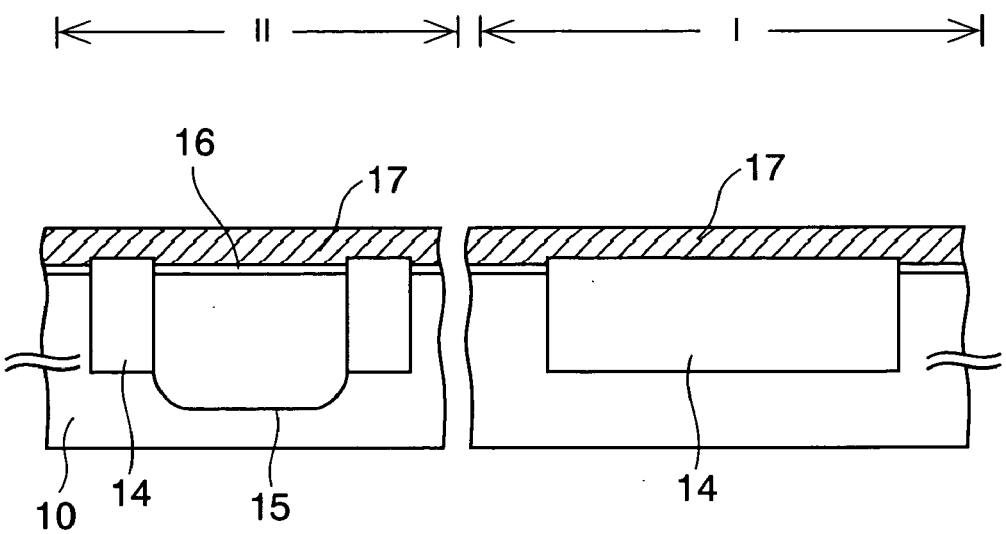
Figure 5F:
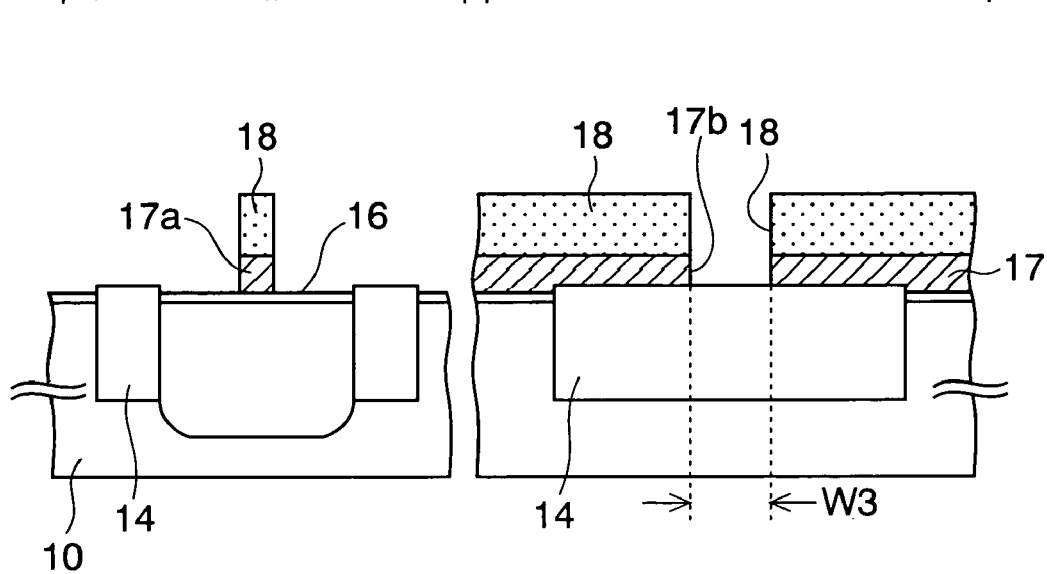
Figure 5G:
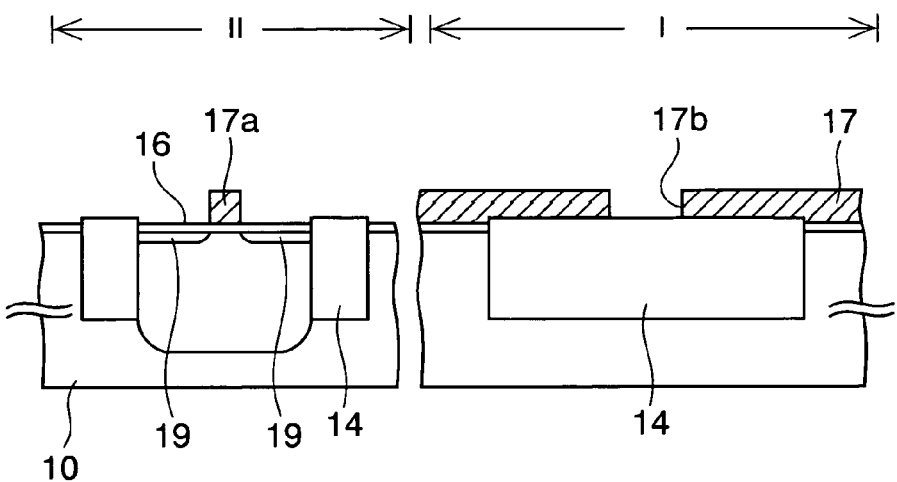
Figure 5H:
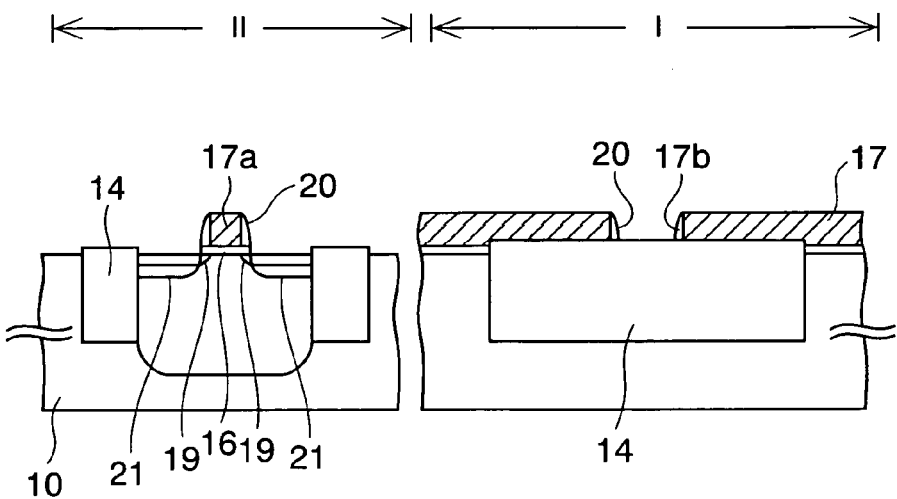
Figure 5I:
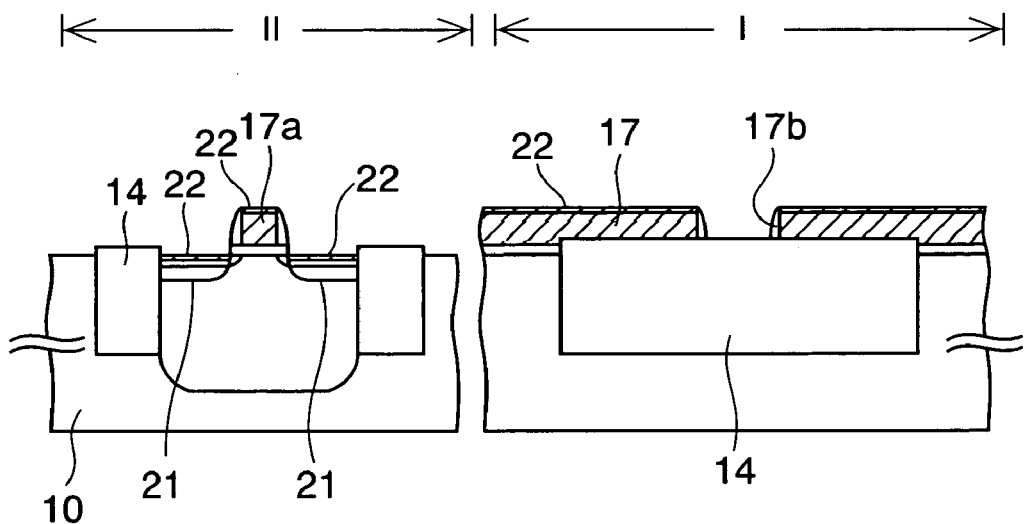
Figure 5J:
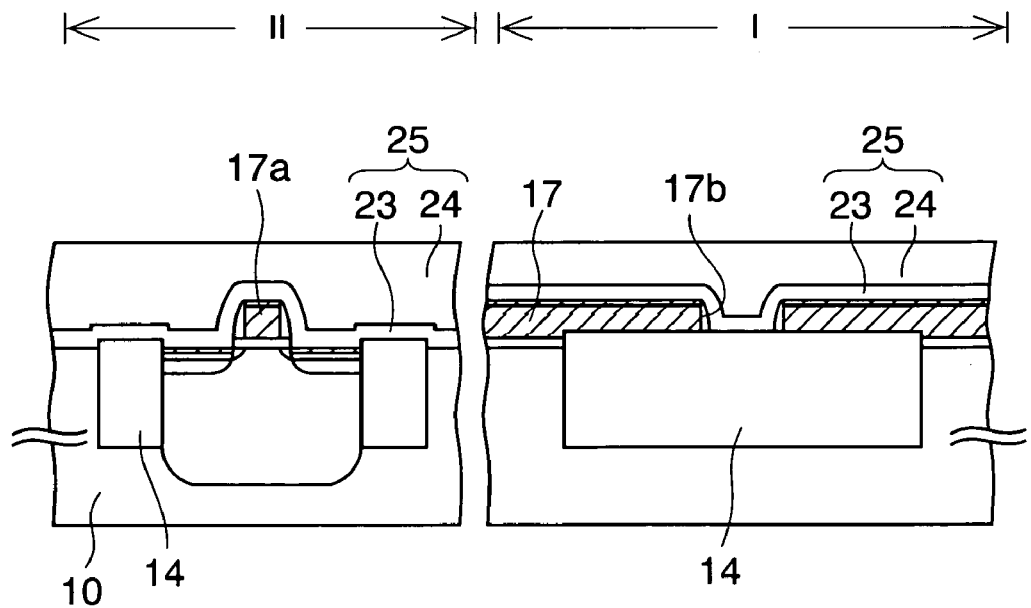
Figure 5K:
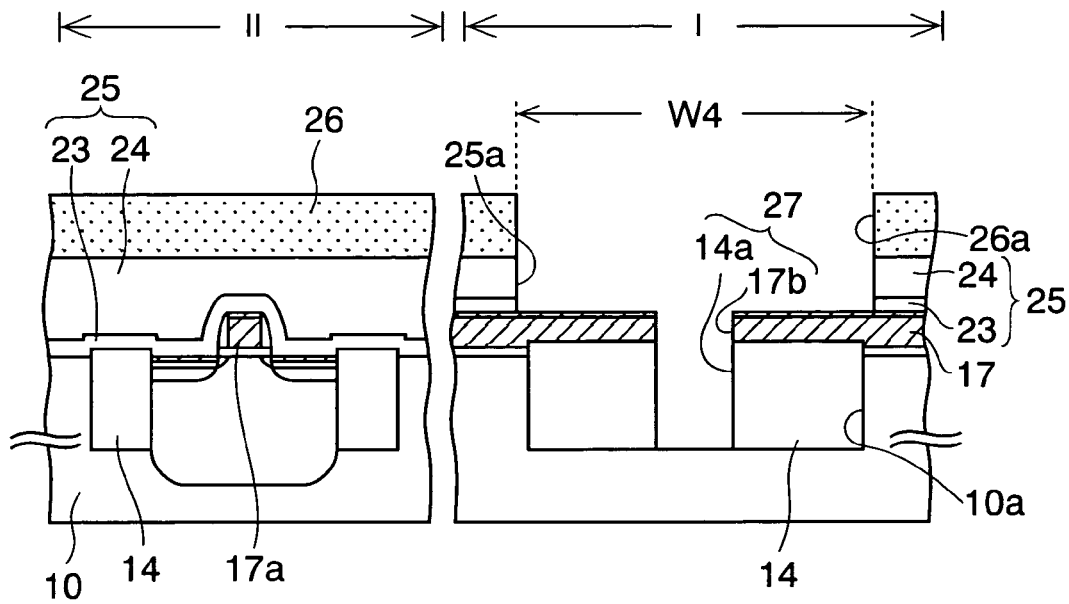
Figure 5L:
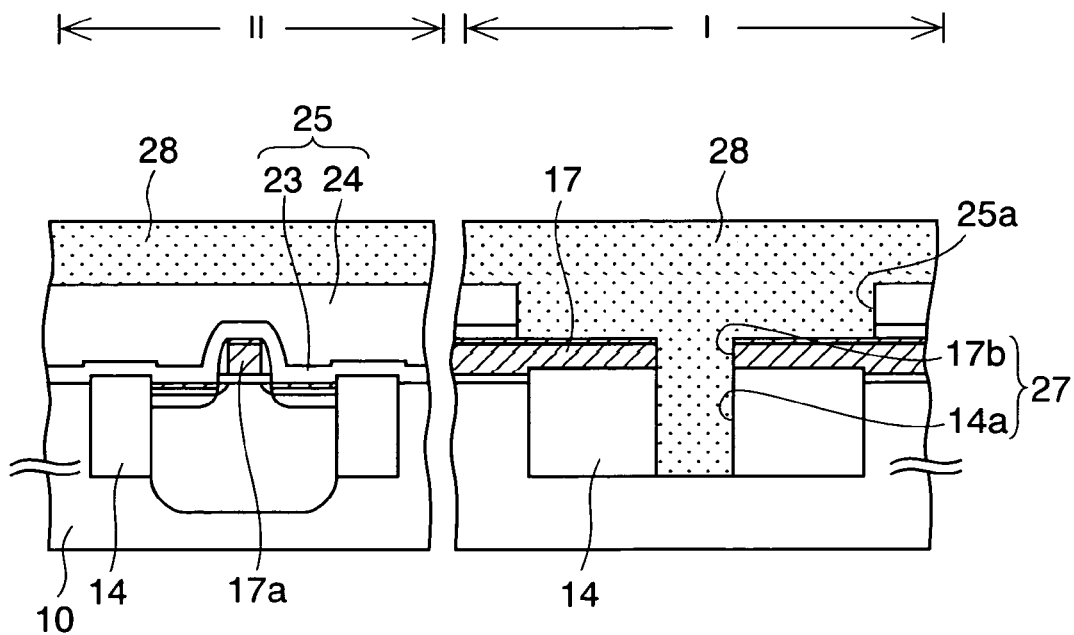
Figure 5M:
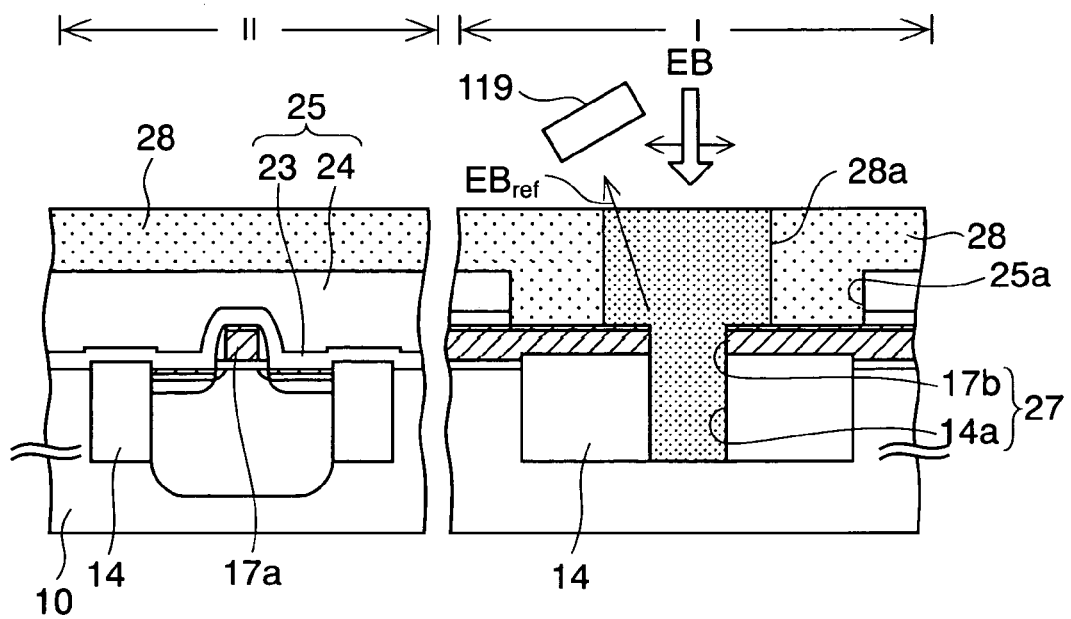
Figure 5N:
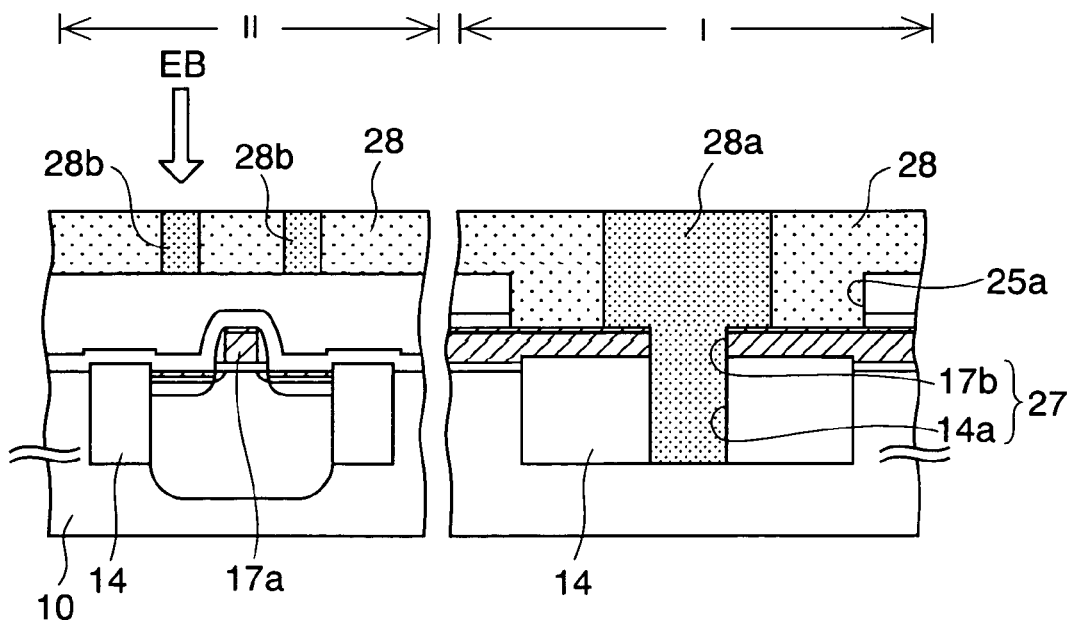
Figure 5O:
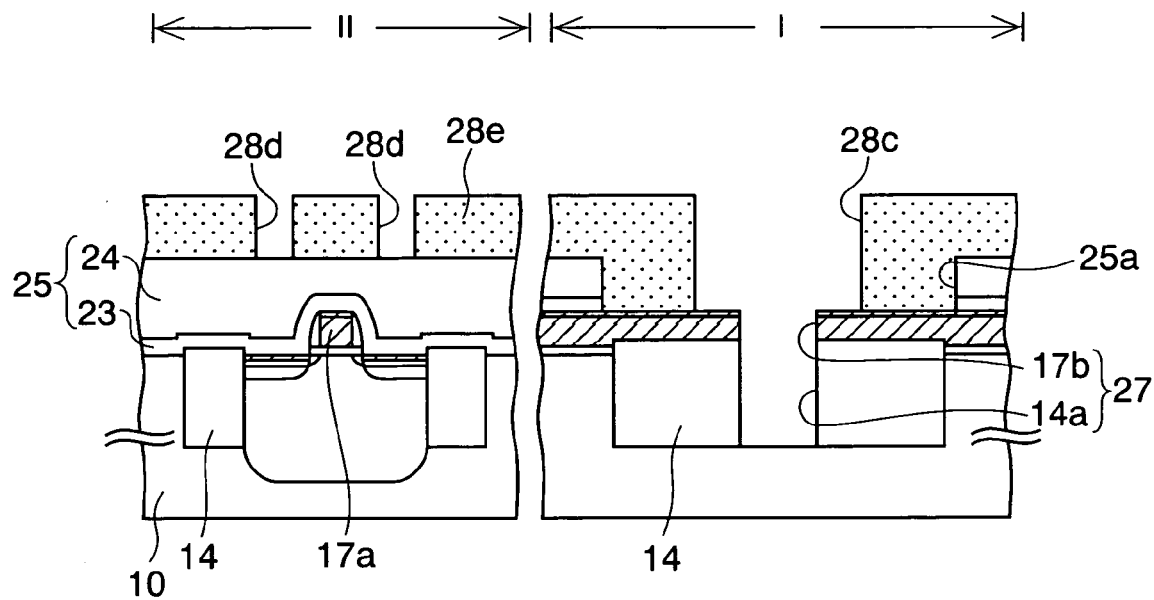
Figure 5P:
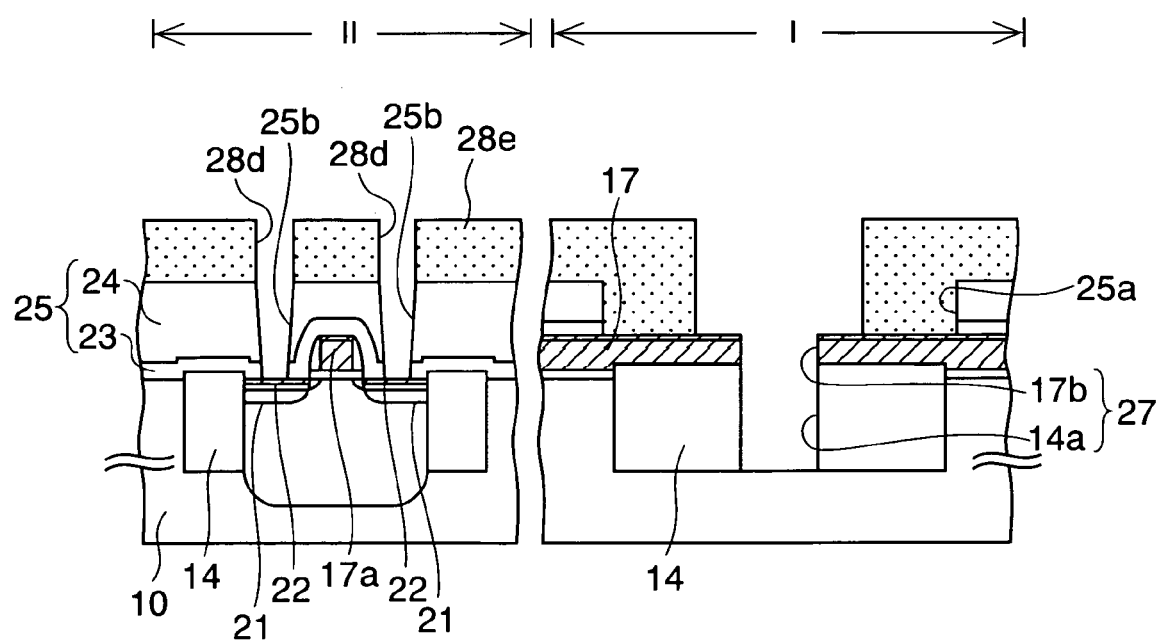
Figure 5Q:
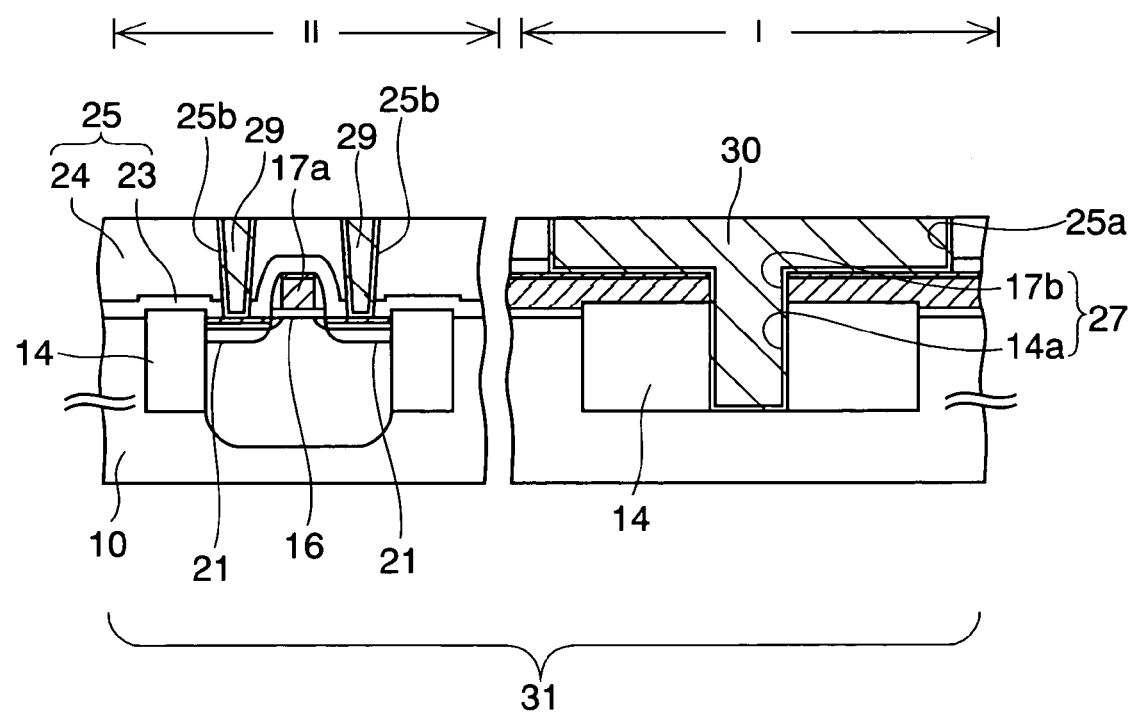

FIG. 5A to FIG. 5Q are cross sectional views in the course of manufacturing a semiconductor device according to the first embodiment of the present invention. Moreover, FIG. 4 is a plan view of the silicon substrate (semiconductor substrate) 10 used in this embodiment.

In this embodiment, as shown in FIG. 4, the silicon substrate 10 used for a multiple chip in which a plurality of chip regions (the second regions) II are separated by a scribe region 10c is used. Then, the first region I is arranged so as to be included in this scribe region 10c, and an alignment mark used for the alignment is formed in this first region I as follows.

First, as shown in FIG. 5A, after forming a thermal-oxide film 11 in the thickness of approximately 10 nm by thermal-oxidizing the above described silicon substrate 10, a silicon nitride film 12 is formed thereon in the thickness of approximately 140 nm by a low pressure CVD (Chemical Vapor Deposition) method.

Then, as shown in FIG. 5B, a first resist pattern 13 which has a first and second windows 13a and 13b on the first and second regions I and II, respectively, is formed on the silicon-nitride film 12. Subsequently, while using this first resist pattern 13 as a mask, the silicon-nitride film 12 is etched by RIE (Reactive Ion Etching) which uses fluoride based gas as etching gas, and first and second holes 12a and 12b are formed in the first and second regions I and II, respectively. Then, the etching gas is changed to chlorine based gas, and a thermal-oxide film 11 under the first and second holes 12a and 12b are etched to form third and fourth holes 11a and 11b.

Then, by further proceeding the etching with the etching gas unchanged, the silicon substrate 10 under the third and fourth holes 11a and 11b are etched to form first and second grooves 10a and 10b used for STI (Shallow Trench Isolation) with a depth of approximately 300 nm in each of the regions I and II. In addition, although the width of these grooves is not limited in particular, the width W2 of the groove of the first groove 10a is set to approximately 40 im in this embodiment.

After that, the first resist pattern 13 is removed.

Then, processes performed until the cross-sectional structure shown in FIG. 5C is obtained will be described. First, a silicon-oxide film is formed on the entire surface of the resultant structure by a plasma CVD method to embed the first and second grooves 10a and 10b with this film completely. Then, this silicon-oxide film is polished by a CMP (Chemical Mechanical Polishing) to remove it from the upper surface of the silicon-nitride film 12 while using the silicon-nitride film 12 as a polishing stopper, and the silicon-oxide film left inside the first and second grooves 10a and 1ob is made into an element isolation insulating film 14. In addition, the silicon-nitride film 12 is film-reduced by this CMP, and the thickness thereof will be thin so as to be approximately 50 nm.

Moreover, although the element isolation insulating film 14 used for STI is formed in the above, the element isolation insulating film may be formed by a LOCOS (Local Oxidation of Silicon) method.

Subsequently, as shown in FIG. 5D, the silicon-nitride film 12 is wet-etched using a phosphoric acid to remove it from each of the regions I and II.

Then, processes performed until the cross-sectional structure shown in FIG. 5E is obtained will be described.

First, by ion-implanting p-type impurities such as B (boron) into the first region I while using the thermal-oxide film 11 as a through-film, a p well 15 is formed. Subsequently, the thermal-oxide film 11 damaged by this ion-implantation is removed by wet-etching to expose a clean face of the silicon substrate 10. In this wet-etching, a hydrofluoric-acid solution is used as an etcher, for example.

Then, the silicon substrate 10 is thermal-oxidized again to form a thermal-oxide film with a thickness of approximately 5 nm, which is made into a gate insulating film 16.

Thereafter, by a CVD method which uses silane as reactive gas, a poly silicon film is formed in the thickness of approximately 100 nm as a conductive film 17 on the element isolation insulating film 14 and on the gate insulating film 16.

Next, as shown in FIG. 5F, a second resist pattern 18 that has a third window 18a in the first region I, and that has the shape of the gate electrode in the second region II, is formed on the conductive film 17. Then, by selectively etching the conductive film 17 by RIE using chlorine based gas as etching gas by use of this second resist pattern 18 as a mask, a first opening 17b is formed in the conductive film 17 of the first region I. At the same time, a gate electrode 17a made of the material of the conductive film 17 is formed in the second region II. In addition, although the width of the first opening 17b is not limited in particular, the width thereof W3 is set to approximately 2 im in this embodiment.

Subsequently, the second resist pattern 18 is removed.

Then, as shown in FIG. 5G, an n-type source/drain extension 19 is formed in the silicon substrate 10 beside the gate electrode 17a by ion-implanting n-type impurities such as As (arsenic) into the silicon substrate 10 by use of the gate insulating film 16 as a through-film.

Then processes performed until the cross-sectional structure shown in FIG. 5H is obtained will be described.

First, after forming an insulating film such as a silicon-oxide film on the entire surface of the resultant structure by a CVD method, this insulating film is etched back to leave the insulating film on the side of the gate electrode 17a as an insulating sidewall 20. Then, by ion-implanting n-type impurities such as P (phosphorus) into the silicon substrate 10 by use of the gate electrode 17a and the insulating sidewall 20 as a mask, an n-type source/drain region 21, which is deeper than the n-type source/drain extension 19 and whose impurity concentration is high, is formed in the silicon substrate 10 beside the gate electrode 17a.

Then, as shown in FIG. 5I, after forming a cobalt film on the entire surface of the surface by a sputtering method, cobalt and silicon are reacted with heat by carrying out RTA (Rapid Thermal Anneal). Subsequently, the un-reacted cobalt film is removed by wet-etching to leave a cobalt silicide layer 22 on the source/drain region 21. This cobalt silicide layer is formed also on the upper surface of the gate electrode 17a, and thereby the gate electrode 17a is made into a polycide structure.

Next, as shown in FIG. 5J, a silicon-nitride film is formed by a CVD method as an etching stopper film 23 on each of the gate electrode 17a and the conductive film 17 as well as in the first opening 17b, and further an insulating film 24 such as a silicon-oxide film is formed thereon by a CVD method. These films 23 and 24 are made into an interlayer insulating film 25. Subsequently, the upper surface of the interlayer insulating film 25 is polished to planarize with a CMP method. As a result of this planarization, the thickness of the interlayer insulating film 25 will be approximately 700 nm on the flat face of the silicon substrate 10.

Then, processes performed until the cross-sectional structure shown in FIG. 5K is obtained will be described.

First, resist is applied onto the interlayer insulating film 25, and by exposing and developing the resist, a third resist pattern 26, which includes a fourth window 26a with a size large enough to encompass the first opening 17b, more preferably with a size large enough to encompass the first groove 10a, is formed.

Subsequently, after the insulating film 24 made of a silicon-oxide film is etched through the fourth window 26a by RIE using $C_4F_8+O_2+Ar$ as etching gas, the etching gas is changed to $C_4F_8+CF_4+O_2+Ar$, and a second opening 25a with a size large enough to encompass the first opening 17b is formed in the interlayer insulating film 25 by etching the etching stopper film 23 made of silicon nitride. The width W4 of this second opening 25a is set to 50 um, for example, in this embodiment.

Next, the etching gas is changed again to $C_4F_8+O_2+Ar$, and the element isolation insulating film 14 made of silicon oxide is etched through the first opening 17b, whereby a hole 14a is formed in the element isolation insulating film 14 under the first opening 17b. In addition, because this hole 14a reaches the bottom of the first groove 10a and the depth of the first groove 10a is approximately 300 nm, the depth of the hole 14a also will be approximately 300 nm.

Each of the above described RIEs can be carried out only by changing the etching gas within one etching chamber. Then, as a result of these etchings, an alignment mark 27, constructed from the first opening 17b and the hole 14a and used for the alignment, is formed in the first region I. It should be noted that, because the thickness of the conductive film 17 is approximately 100 nm and the depth of the hole 14a is approximately 400 nm, the depth of the alignment mark 27 is approximately 500 nm combining these.

Subsequently, the third resist pattern 26 is removed.

Figure 6:
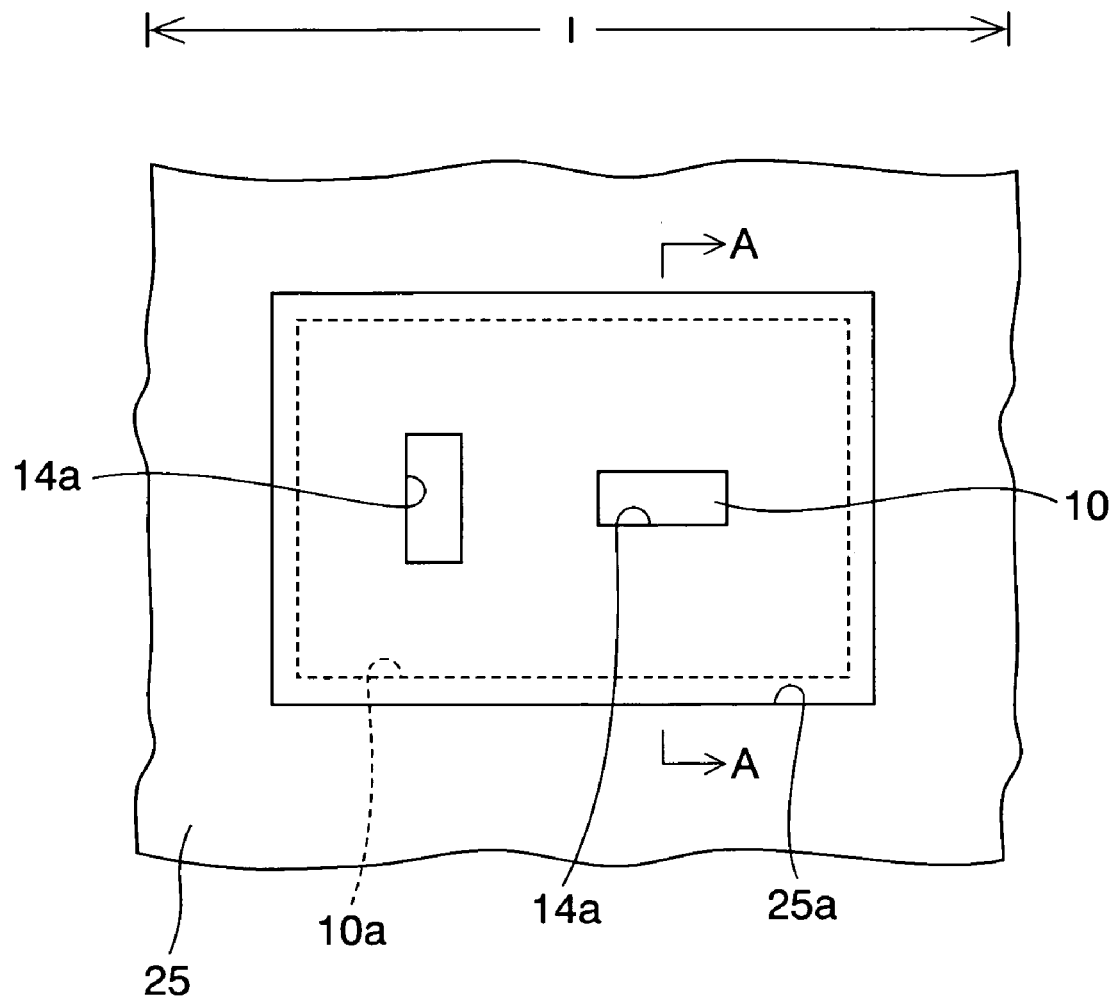
FIG. 6 is a plan view in the course of manufacturing the semiconductor device according to the first embodiment of the present invention.

FIG. 6 is an enlarged plan view of the first region I after completing this process, in which the first region I of FIG. 5K described above corresponds to the sectional view along the A-A line of FIG. 6. However, in FIG. 6, the first opening 17b which overlaps the hole 14a is omitted.

As shown in FIG. 6, in this embodiment, the first opening 17b and the hole 14a are provided respectively by two inside the second opening 25a, and the two alignment marks 27 constituted by these are formed. Furthermore, the plan shape of this alignment mark 27 is a rectangular having the sides parallel to the X-axis direction and the Y-axis direction which are the basic axes of the scanning of the electron beam EB, and one of the alignment marks 27 is made by rotating the other alignment mark 27 by 90° in plane.

Figure 7:
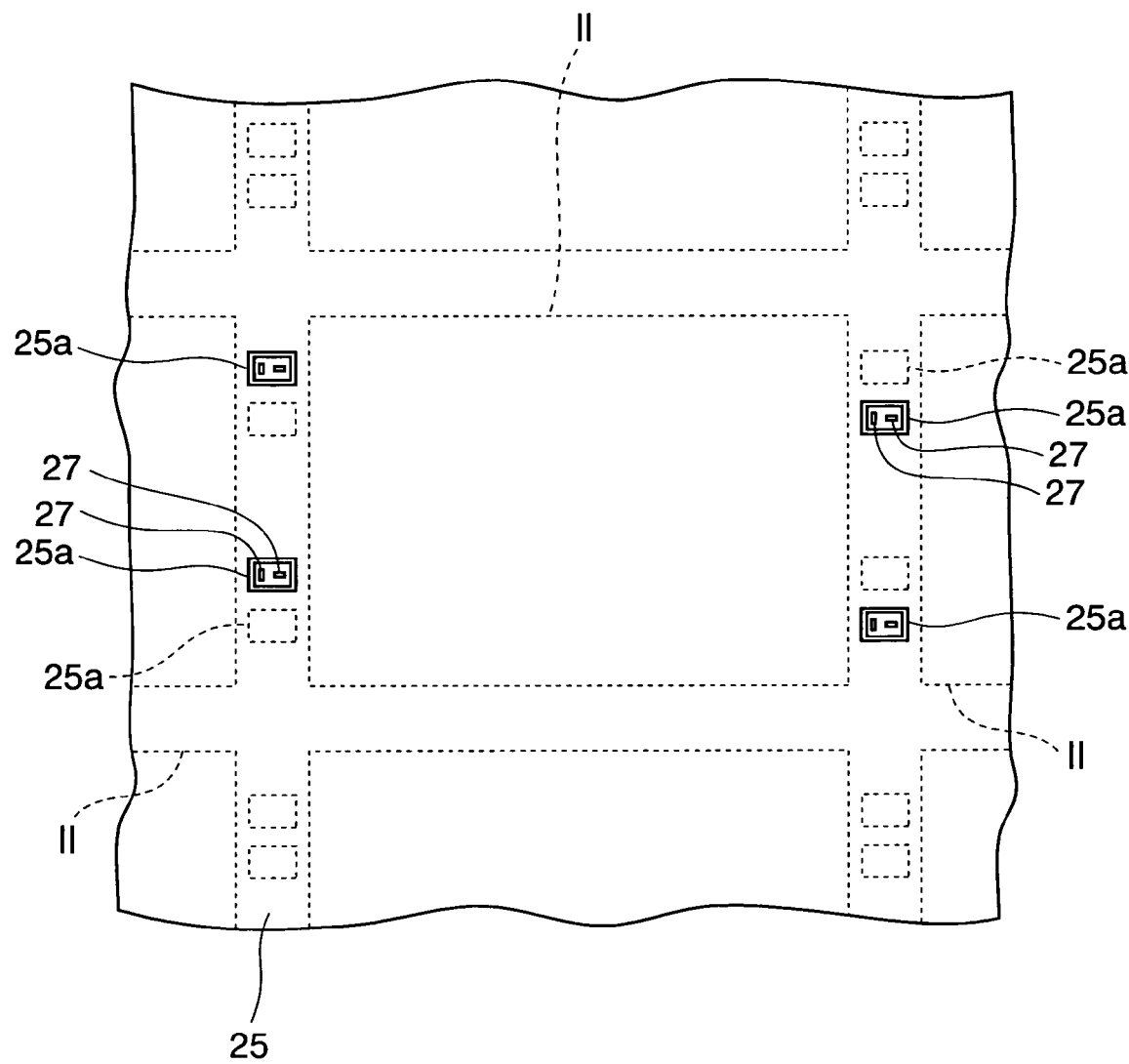
FIG. 7 is an enlarged view of one chip II and a periphery thereof in the course of manufacturing the semiconductor device according to the first embodiment of the present invention.

Moreover, FIG. 7 is an enlarged plan view of one chip-region II and a periphery thereof.

As shown here, the four second openings 25a in the interlayer insulating film 25 in which the alignment mark 27 is accommodated are provided by four for the chip region II in the center of FIG. 7. In addition, the second opening 25a shown by the dotted line is used for the chip region II in the periphery.

Figure 8:
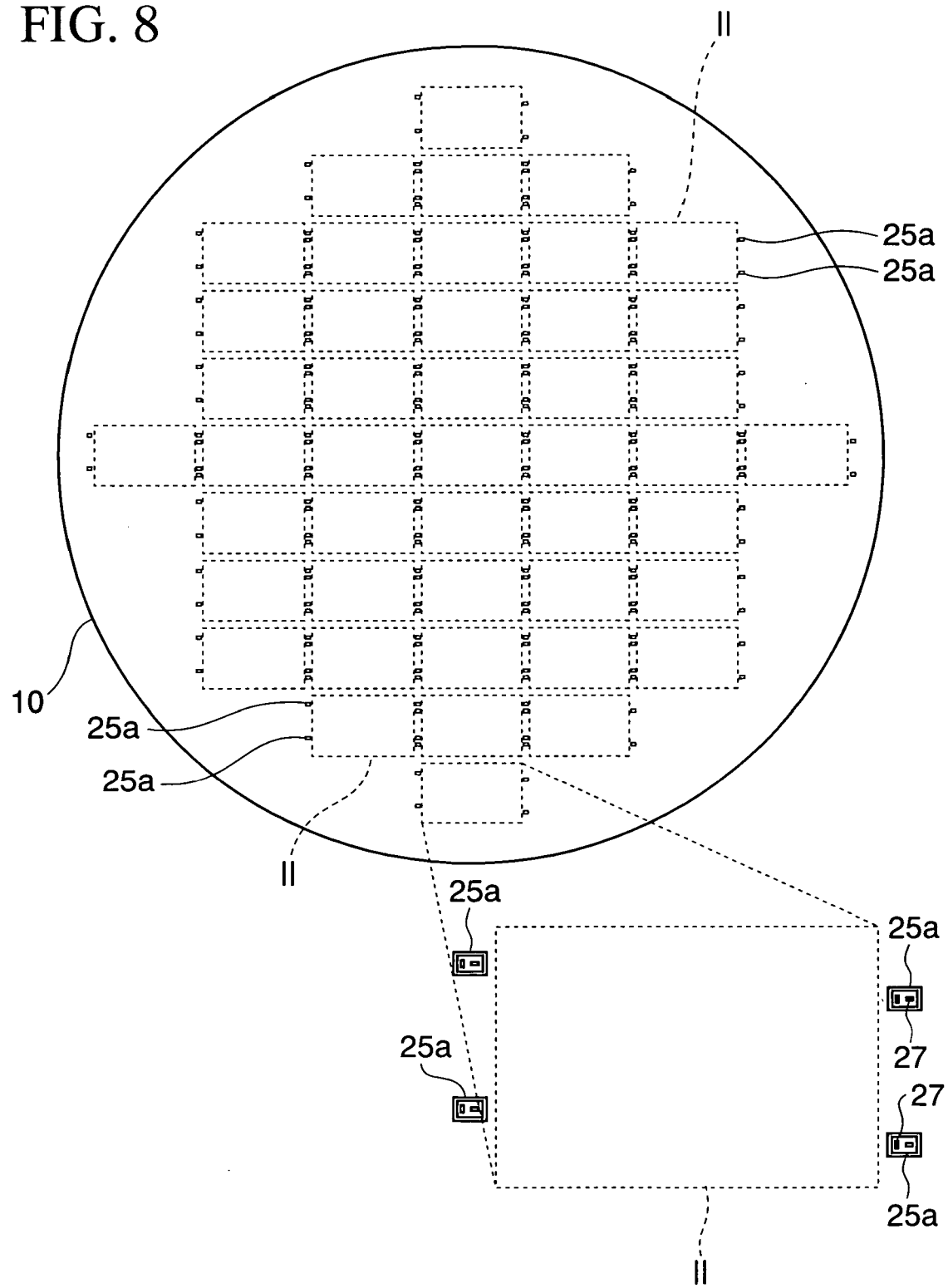
FIG. 8 is a plan view of the whole silicon substrate in the course of manufacturing the semiconductor device according to the first embodiment of the present invention.

On the other hand, FIG. 8 is the whole plan view of the silicon substrate 10 after completing the processes heretofore.

Then, as shown in FIG. 5L, a positive type electron-beam resist 28 is applied onto the interlayer insulating film 25 and into the alignment mark 27 by a spin coating method.

Next, processes performed until the cross-sectional structure shown in FIG. 5M is obtained will be described.

First, after placing the silicon substrate 10 on the X-Y stage 111 of the electron beam exposure apparatus that was described with reference to FIG. 3, the inside of the electron optics system column 113 is decompressed below a predetermined pressure.

Then, as shown in FIG. 5M, the alignment mark 27 is scanned by the electron beam EB through the resist 28, and the reflected electron $EB_{ref}$ which comes out of the alignment mark 27 is measured by the detector 119. Although the method of this scanning is not limited in particular, the electron beam EB is deflected by the deflector 115 (refer to FIG. 3) in a state where the silicon substrate 10 is fixed, in this embodiment.

Figure 9:
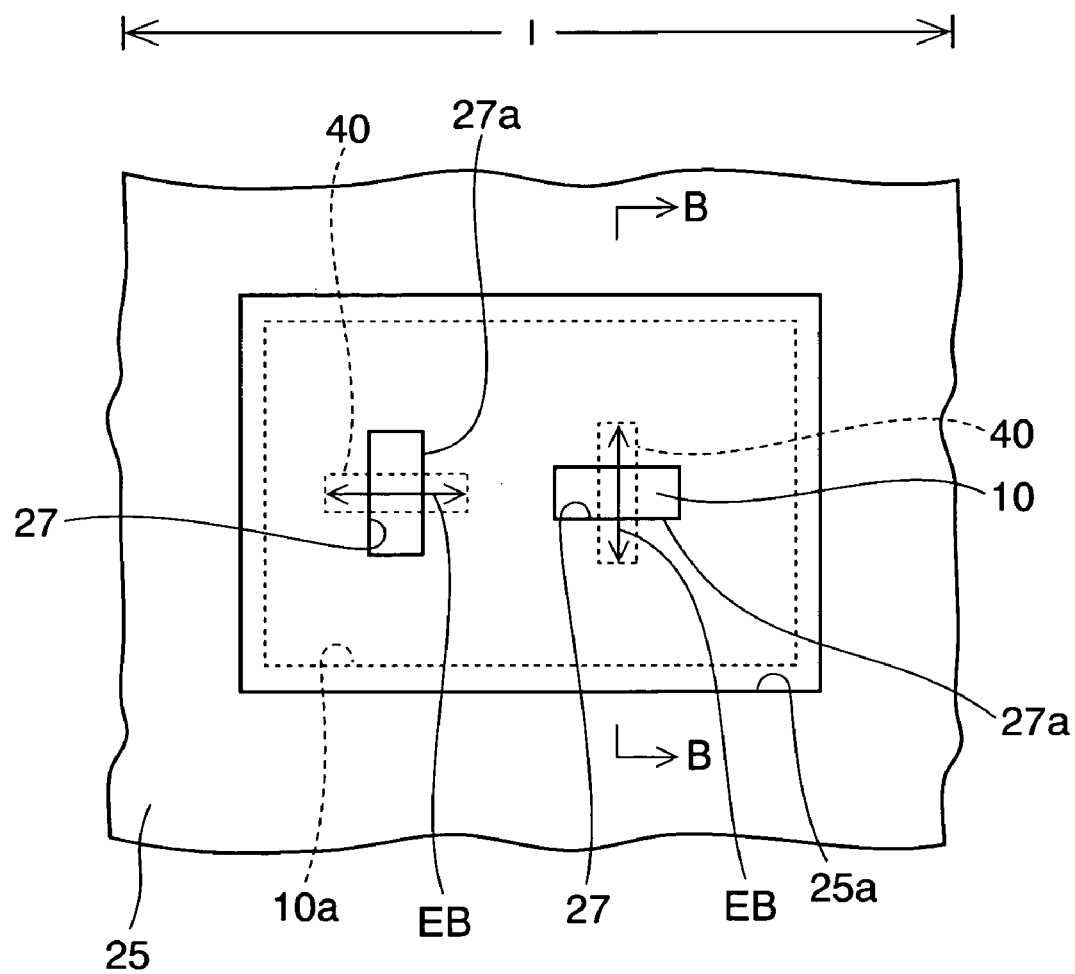
FIG. 9 is a plan view showing a deflection region of an electron beam in the first embodiment of the present invention.

FIG. 9 is a plan view showing a deflection region 40 of the electron beam EB, and the first region I of FIG. 5M described above corresponds to the sectional view along the B-B line of FIG. 9.

As shown in FIG. 9, in this embodiment, to two rectangular alignment marks 27 which face to the X direction and the Y direction, respectively, the electron beam EB is deflected along the short side direction thereof. If doing this way, even if there are some positional misalignments between the silicon substrate 10 and the electron beam apparatus the electron beam EB will cross a long side 27a of the alignment mark 27 certainly. Accordingly, the reflected electron from the alignment mark 27 can therefore be easily obtained. Note that, the scanning order of the electron beam for the two alignment marks 27 is not limited in particular. For example, the alignment mark 27 which faces to the X direction may be scanned first with the electron beam EB, and thereafter the alignment mark 27 which faces to the Y direction may be scanned. Alternatively, the reverse order of the scanning is feasible.

Figure 12:
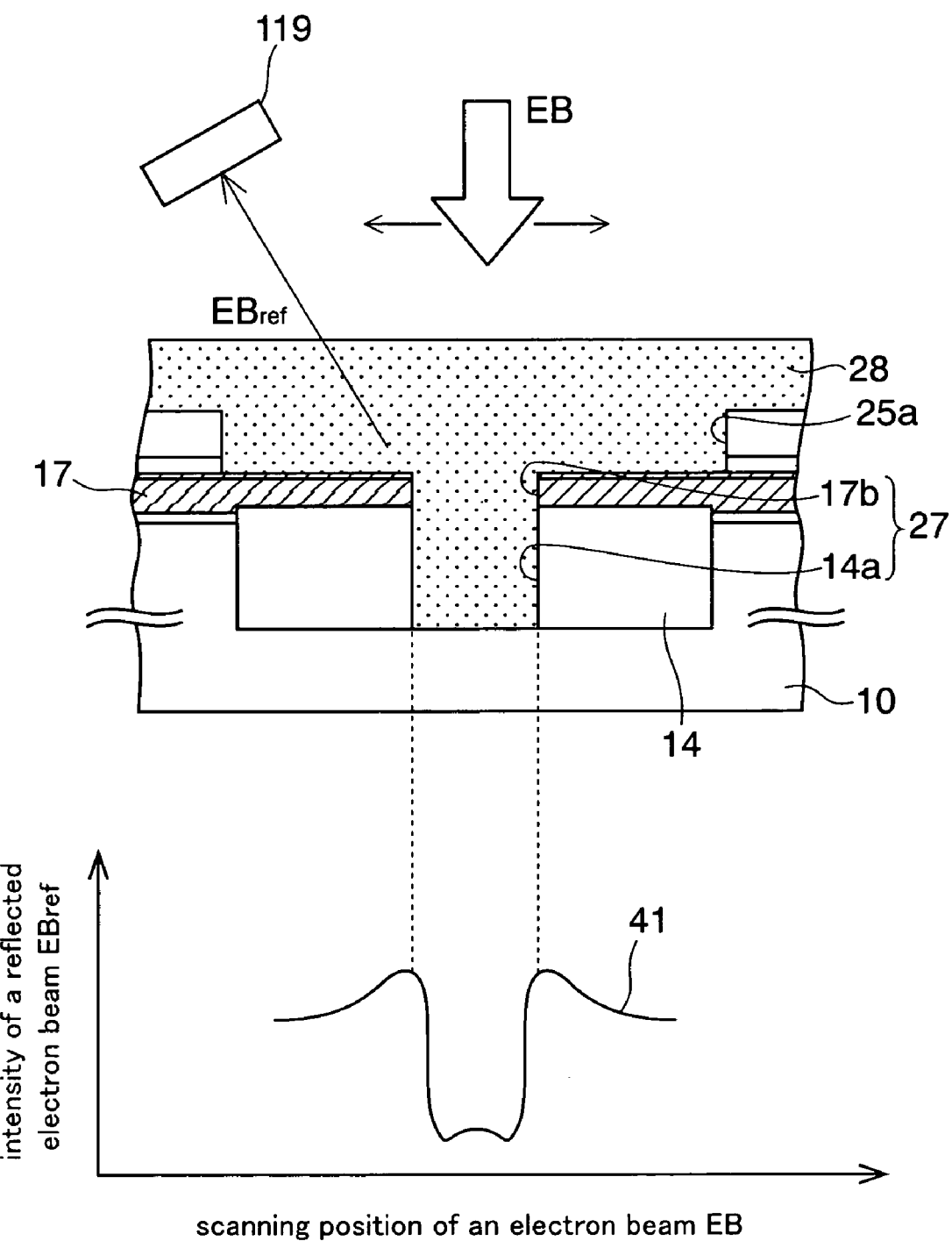
FIG. 12 is a view showing one example of a waveform outputted from a detector, when one alignment mark is scanned with an electron beam in the first embodiment of the present invention.
Figure 13:
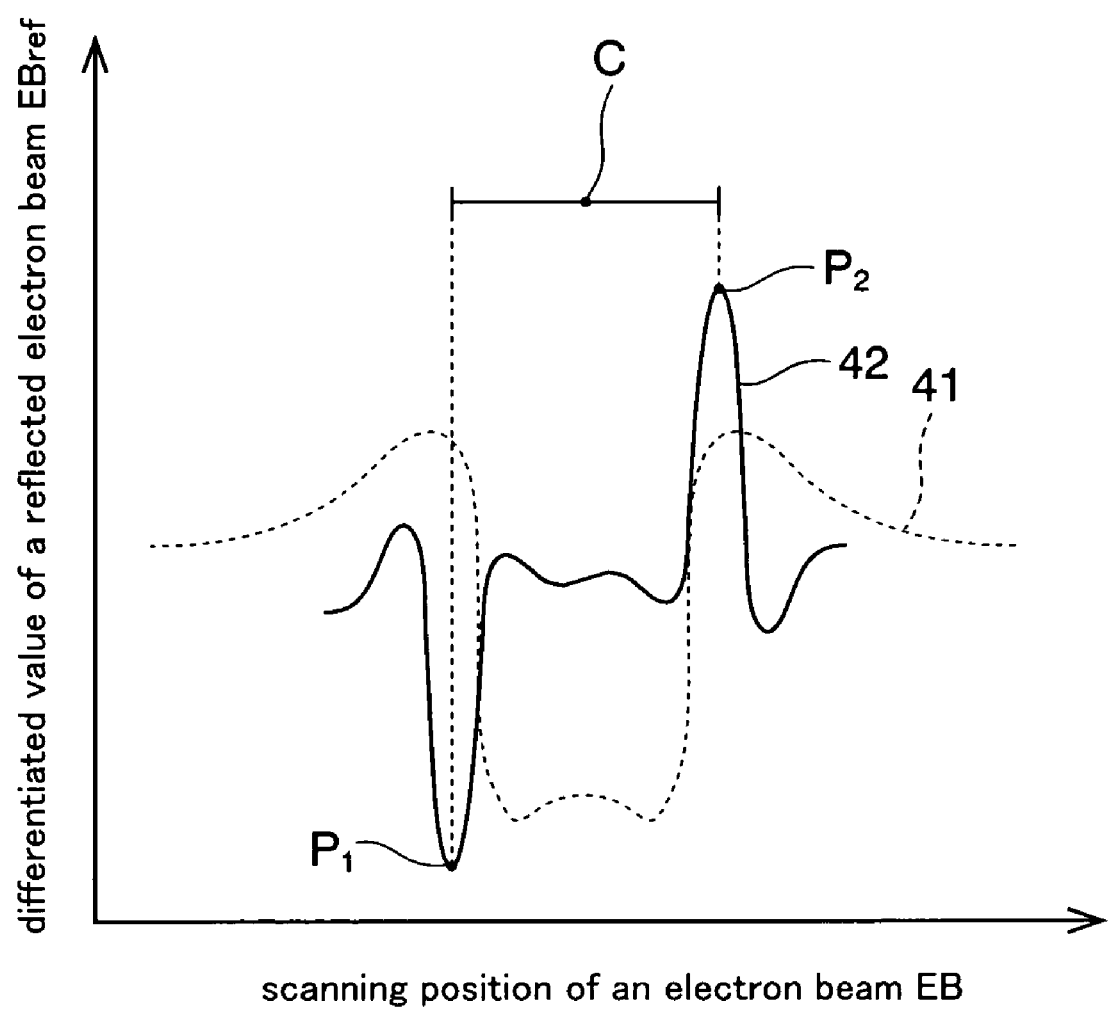
FIG. 13 is a view showing a waveform obtained by differentiating the waveform of FIG. 12.

FIG. 12 shows one example of the waveform 41 outputted from the detector 119 when one alignment mark 27 is scanned with the electron beam EB, in which the horizontal axis expresses the scanning position of the electron beam EB, and in which the vertical axis expresses the intensity of the reflected electron. This waveform 41 is converted to a digital value in the A/D converter 113a of FIG. 3, and thereafter is differentiated in a waveform analyzing section 113 to become a waveform 42 as shown in FIG. 13. Then in the waveform analyzing section 113, the center C of two peaks $P_1$ and $P_2$ of the waveform 42 is recognized as the center of the valley of the waveform 41, i.e., the center of the alignment mark 27, and the position data $D_0$ which indicates this center position is outputted to the digital control section 106. Then, the position data $D_0$ is inputted to the pattern generation/correction circuit 108 of the digital control section 106 via the bus 121, and based on this position data $D_0$, the circuit 108 generates the deflection correcting data $D_c$ as described above.

Then, in the subsequent exposure, the deflection data D is corrected by adding the deflection correcting data $D_c$ described above to the deflection data D outputted from the control workstation 102, and based on the data obtained by the correction result, the electron beam EB is deflected. Such a correction of the deflection data D will be referred to also as a positional misalignment correction between the electron beam exposure apparatus and the silicon substrate 10 in this embodiment.

Moreover, in this embodiment, because the two alignment marks 27 which respectively face to the X direction and to the Y direction as shown in FIG. 9 are used, deflection correcting data $D_c$ in each of the X direction and the Y direction can be obtained, and by the deflection correcting data $D_c$, the two-dimensional positional misalignment of the semiconductor substrate 10 can be grasped.

Furthermore, in this embodiment, as shown in FIG. 7, the second opening 25a in which the alignment mark 27 is accommodated is arranged at the four corners of the outside of each chip region II, and the positional misalignment is determined for each chip region II by scanning the alignment marks 27 of these four corners individually. According to this, because local positional misalignment can be grasped for each chip region II, accuracy of the positional misalignment correction can be increased.

Incidentally, as shown in FIG. 5M, in this embodiment, the alignment mark 27 is scanned by the electron beam EB in a state where the resist 28 applied. However, since the resist 28 is approximately transparent to the electron beam EB, the reflected electron from the alignment mark 27 can be captured, even under a state where the resist 28 is applied. However, as a result of scanning this way, the resist 28 on the alignment mark 27 will be exposed by the electron beam EB, and a first exposed portion 28a is formed in the resist 28 of this portion.

Thereafter, in a state where the silicon substrate 10 is placed on the X-Y stage 111 (refer to FIG. 3), the deflection data D which draws the hole formation region is generated in the control workstation 102, and the electron beam EB is deflected by the amount obtained by adding the correction data $D_c$ to this deflection data D.

Accordingly, as shown in FIG. 5N, the resist 28 that exists in the portion of the hole formation region of the second region II is exposed by the electron beam EB after the correction of the positional misalignment, and a second exposed portion 28b which is aligned with the gate electrode 17a in the underlying layer with high precision is formed in the resist 28.

Subsequently, as shown in FIG. 5O, the silicon substrate 10 is taken out from the above described electron beam exposure apparatus, and the first and second exposed portions 28a and 28b are removed by developing the resist 28, thus forming a fourth resist pattern 18e. In this fourth resist pattern 18e, a fifth window 28c is formed in the portion corresponding to the first exposed portion 28a (refer to FIG. 5M) owing to the fact that the alignment mark 27 is scanned at the time of the alignment. Moreover, in the second region II, a sixth window 28d is formed in the portion corresponding to the second exposed portion 28b (refer to FIG. 5M).

Figure 10:
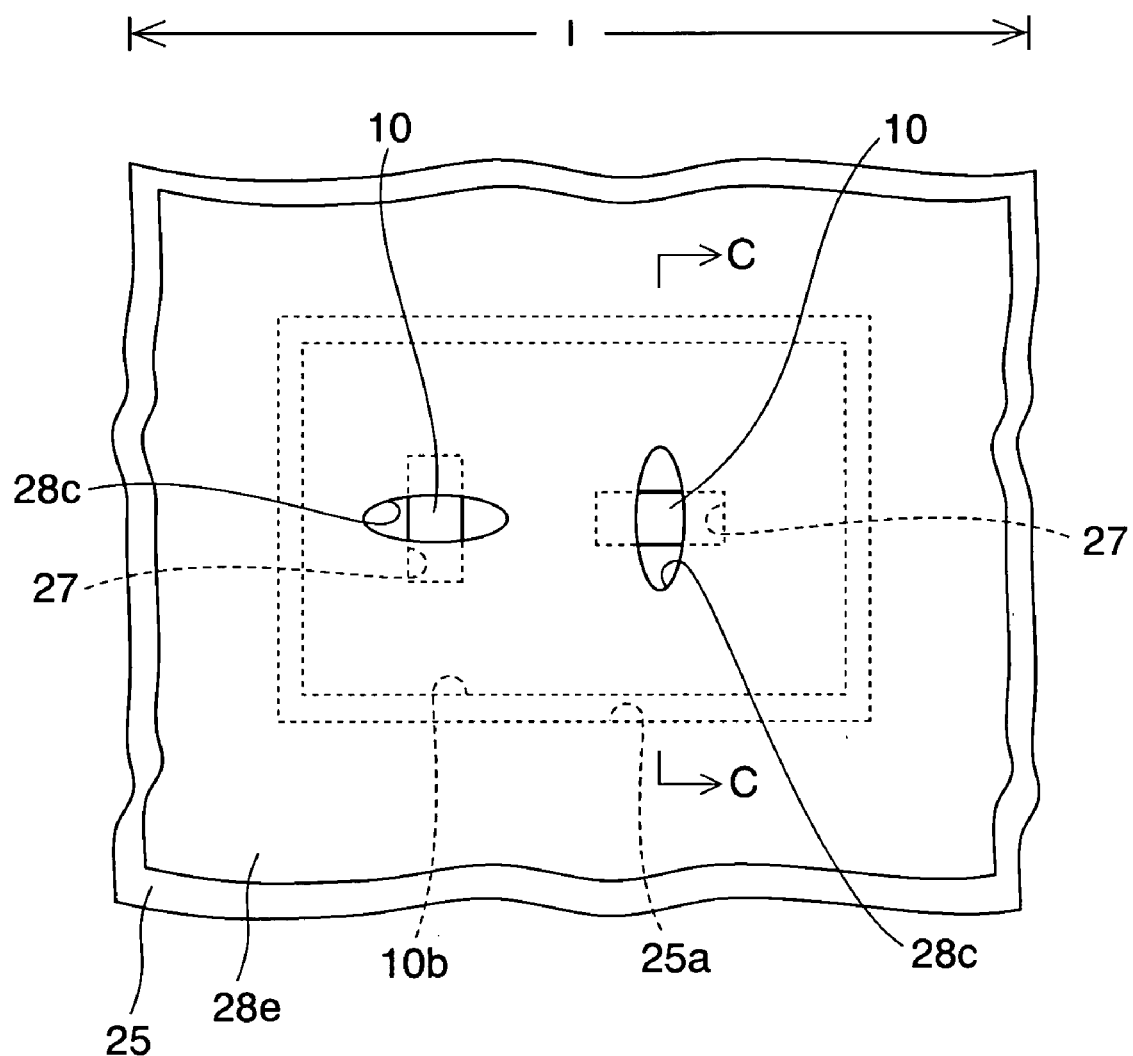
FIG. 10 is a plan view after forming a fourth resist pattern in the first embodiment of the present invention.

FIG. 10 is a plan view of the first region I after completing this process, and the first region I of FIG. 5O described above corresponds to the sectional view along the C-C line of FIG. 10.

As shown in FIG. 10, the plan shape of the fifth window 28c is elliptic corresponding to the scanned portion of the electron beam EB.

Then, as shown in FIG. 5P, the interlayer insulating film 25 is etched by RIE by use of the fourth resist pattern 28e as a mask. Thus, a hole 25b with a depth deep enough to reach the n-type source/drain region 21 is formed in the interlayer insulating film 25a. This etching is carried out in two steps consisting of etching to the insulating film 24 and etching to the etching stopper film 23, and in the etching of the etching stopper film 23, the cobalt silicide layer 22 in the foundation functions as the etching stopper. Then, as for etching gas in these etchings, $C_4F_8+O_2+Ar$ is used for the insulating film 24 made of silicon oxide, and $C_4F_8+CF_4+O_2+Ar$ is used for the etching stopper film 23 made of silicon nitride.

Thereafter, the fourth resist pattern 18e is removed.

Figure 11:
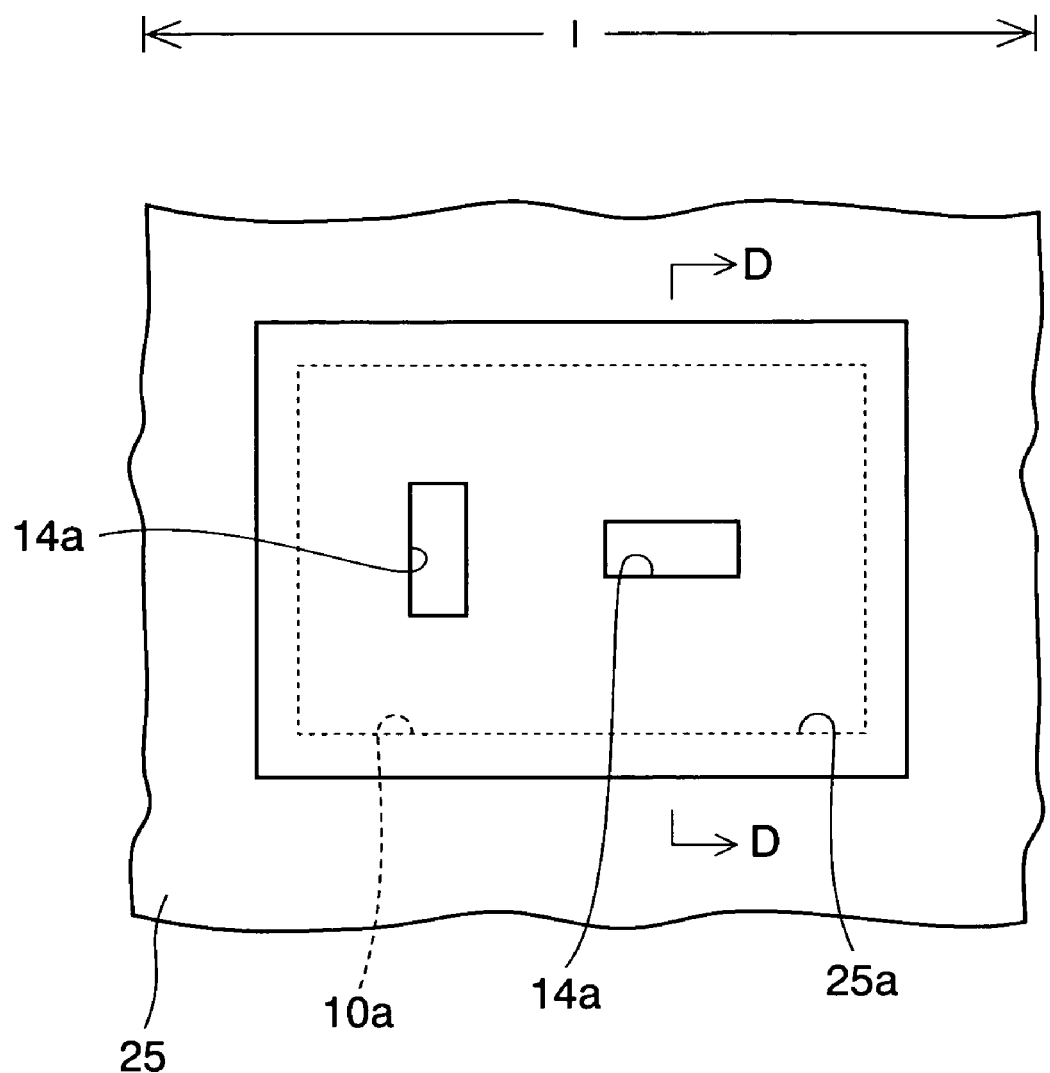
FIG. 11 is a plan view after etching an interlayer insulation film in the first embodiment of the present invention.

FIG. 11 is a plan view after completing this process, and the first region I of FIG. 5P described above corresponds to the sectional view along the D-D line of FIG. 11.

Then, processes performed until the cross-sectional structure shown in FIG. 5Q is obtained will be described.

First, a Ti (titanium) film and a TiN (titanium nitride) film are formed on the entire surface of the resultant structure by a sputtering method in this order, thus forming a glue film with these films. Subsequently, on this glue film, a W (tungsten) film is formed by a CVD method that uses tungsten hexafluoride as reaction gas, and the hole 25b and the alignment mark 27 are completely embedded with this W film. Subsequently, the unnecessary glue film and W film on the interlayer insulating film 25 are removed by a CMP method, and these films are left in the hole 25b and the alignment mark 27, as well as in the second opening 25a as an conductive plug 29 and as a conductive body 30. In addition, the upper surface of these conductive plug 29 and conductive body 30 have the equal height to the upper surface of the interlayer insulating film 25, as a result of the above described CMP. Moreover, the conductive plug 29 is electrically connected to the n-type source/drain region 21.

Figure 14:
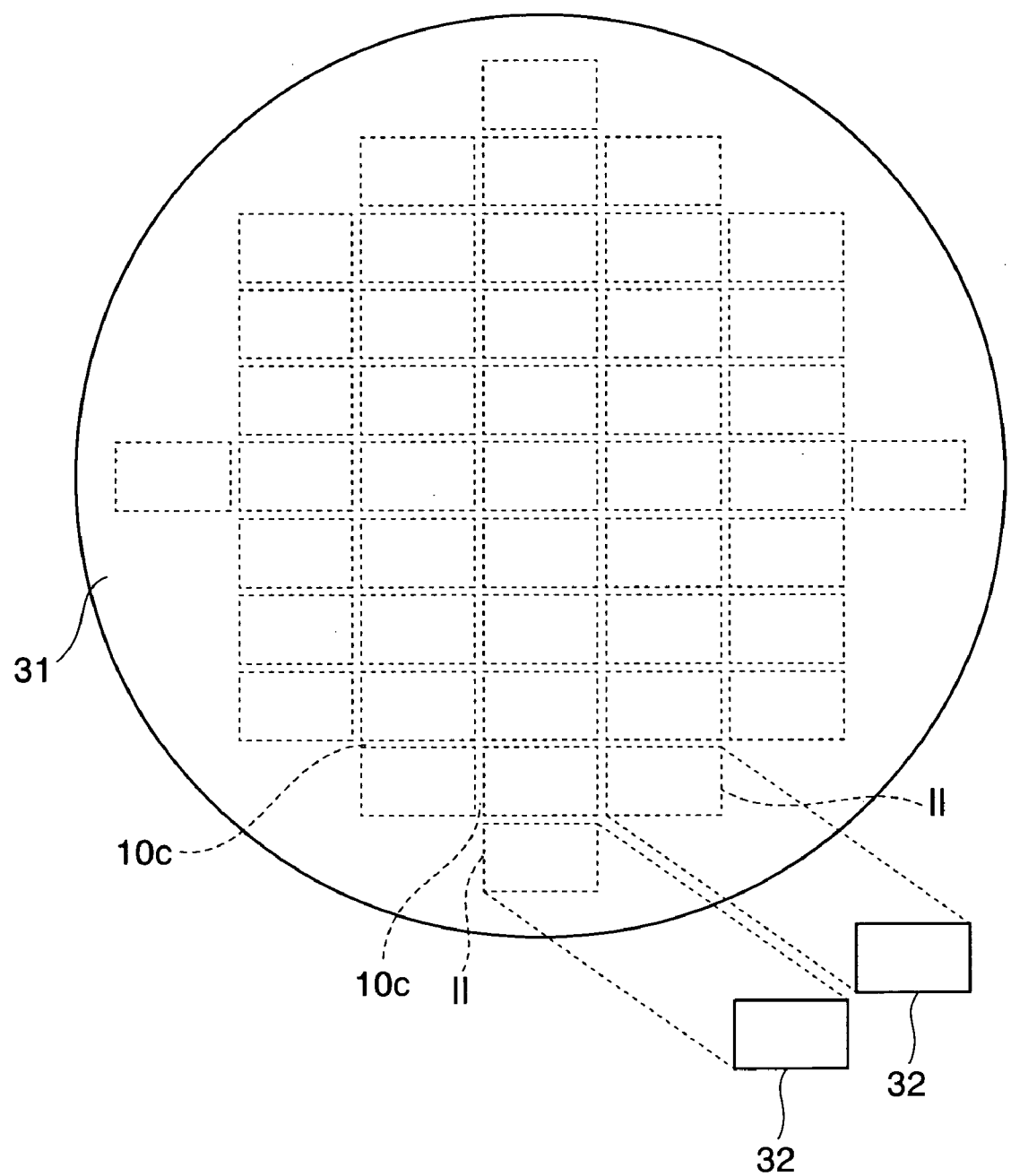
FIG. 14 is a plan view showing a process of singulating a semiconductor wafer in the first embodiment of the present invention.

The basic structure of a semiconductor wafer 31 according to this embodiment is completed through the processes heretofore. After this, as shown in FIG. 14, by dicing the semiconductor wafer 31 along the scribe region 10c which includes the first region I, the semiconductor wafer 31 is singulated to obtain a plurality of semiconductor chips (semiconductor elements) 32.

By the above, the basic process of the method of manufacturing the semiconductor device according to this embodiment is completed.

According to this embodiment described above, as shown in FIG. 5M, the hole 14a of the element isolation insulating film 14 forms the alignment mark 27 in cooperation with the first opening 17b. For this reason, as compared with the case where the first opening 17b formed in the conductive film 17 used for the gate electrode 17a is solely used as the alignment mark, the alignment mark 27 is deepened to 500 nm by the amount of the depth of the hole 14a. Consequently, when the alignment mark 27 is scanned by the electron beam EB, the fall of the graph 41 of the intensity of the reflected electron due to this mark 27 appears distinctly as shown in the FIG. 12, and the position of the mark 27 can easily be determined. Accordingly, even when the thin conductive film 17 used for the gate electrode is formed on the silicon substrate 10, the amount of deflection of the electron beam EB can be corrected with high precision by use of the position of the alignment mark 27. Accordingly, as shown in FIG. 5N, because the electron beam EB can be accurately deflected to the hole formation region in the second region II to form the second exposed portion 28b, the alignment between the hole 25b and the gate electrode 17a shown in FIG. 5P can be carried out with high precision. By these, in this embodiment, it is possible to prevent the device failure due to the positional misalignment between the electron beam exposure apparatus and the silicon substrate 10, and refining of the semiconductor device can be attained.

(2) Second Embodiment

This embodiment differs only in the position of the first region I, in which the alignment mark 27 is formed, as compared with the first embodiment, and because the manufacturing method is the same as the first embodiment, the description regarding the manufacturing method is omitted.

Figure 15:
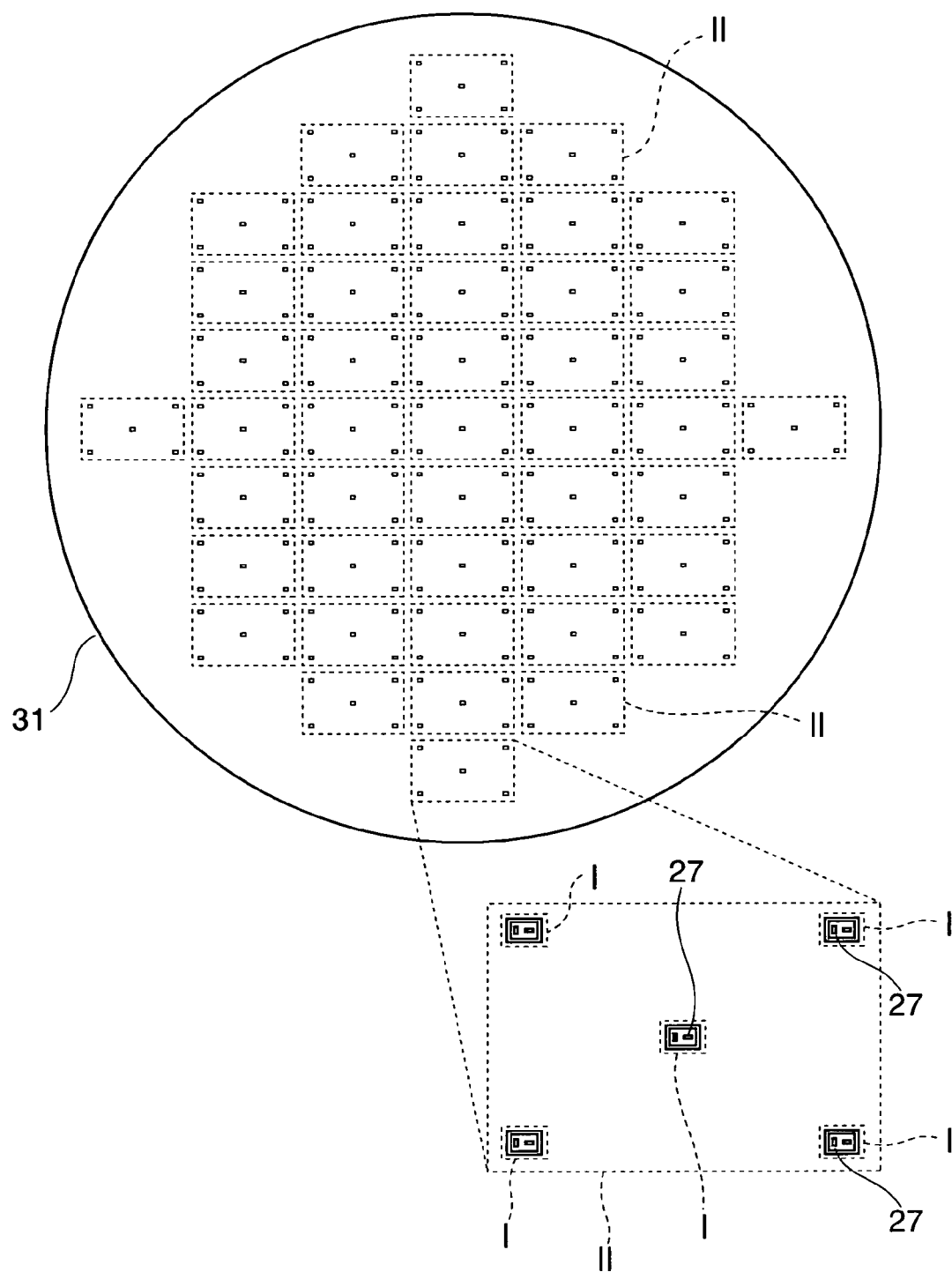
FIG. 15 is a plan view of a semiconductor wafer according to a second embodiment of the present invention.

FIG. 15 is a plan view of the semiconductor wafer according to this embodiment.

In the first embodiment described above, the first region I where the alignment mark 27 is formed is formed so as to be included in the scribe region. On the other hand, in this embodiment, as shown in FIG. 15, the first region is included in the chip region (the second region II).

With such an arrangement, the distance between the first region I and each point inside the chip region II becomes shorter as compared with the first embodiment in which the first region I exists outside the chip region II. It is therefore possible to correct the local positional misalignment for each chip region II with high precision by scanning with the electron beam the alignment mark 27 which is to be formed in the first region I.

Figure 16:
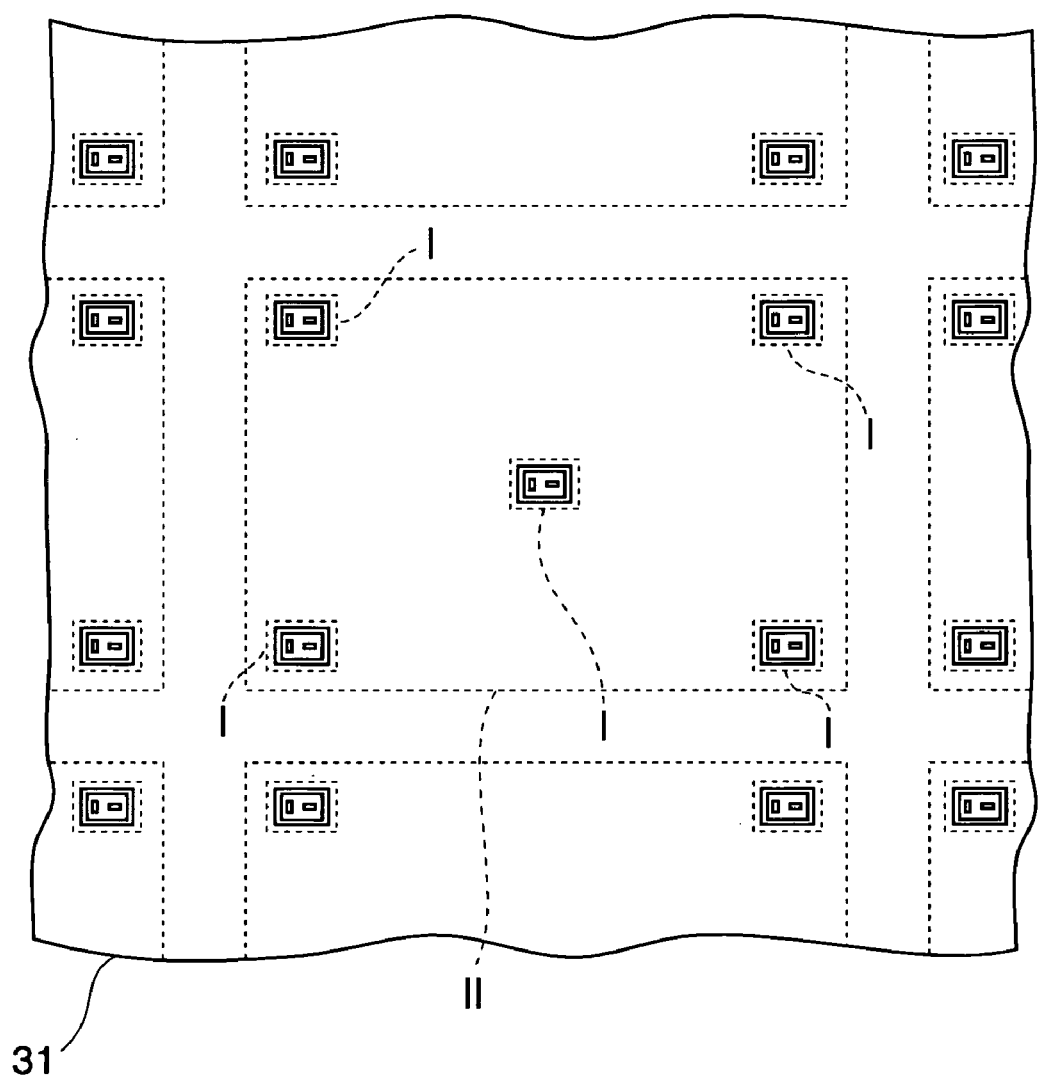
FIG. 16 is an enlarged view of a chip region of FIG. 15 and a periphery portion thereof.

FIG. 16 is an enlarged plan view of one chip-region II of FIG. 15 and a periphery portion thereof.

As shown in this view, in this embodiment, the five second regions I are included in one chip-region II, four of which are arranged at the four corners of the chip region II, and the remaining one is arranged in the center of the chip region II. By such an arrangement, because each of the first regions I can be equally distributed inside the chip region II while extending the space between the first regions I to the maximum extent, the positional misalignment of the chip region II can be determined with higher precision as compared with the first embodiment.

Figure 17:
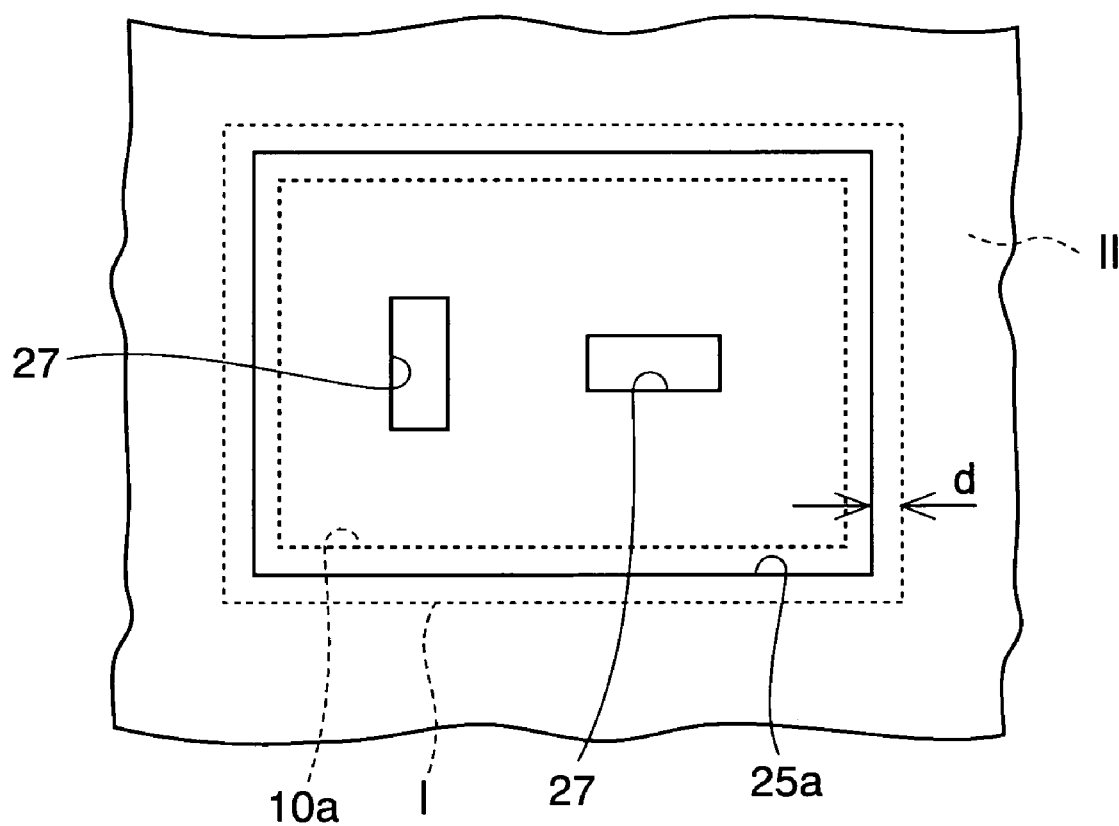
FIG. 17 is an enlarged plan view of the first region I in a second embodiment of the present invention.

FIG. 17 is an enlarged plan view of the first region I of this embodiment.

As shown here, the dotted line which delimits the first region I is separated with a predetermined distance d from the second opening 25a in which the alignment mark 27 is included. Then, in the first region I of the outside portion of the second opening 25a, structures such as the alignment mark 27 and transistors are not created by carrying out a pattern-avoiding process in designing the device.

According to the present invention, the hole of the element isolation insulating film as well as the first opening of the conductive film are used as the alignment mark when the alignment of the electron beam exposure apparatus with the semiconductor substrate is carried out. Thus, because the mark becomes deeper by the amount of the depth of the hole as compared with the case where only the first opening is used as the alignment mark, a distinct strength/weakness appears in the intensity of the reflected electron when the mark is scanned, and thus it becomes easy to determine where the mark exists in the semiconductor substrate. Consequently, the alignment between the semiconductor substrate and the electron beam exposure apparatus can be carried out with high precision, whereby device failures due to these positional misalignments can be prevented while further refining of semiconductor devices can be attained.

What is claimed is:

1. A method of manufacturing a semiconductor device comprising the steps of:
    forming an element isolation insulating film in a first region of a semiconductor substrate;
    forming a gate insulating film in a second region of the semiconductor substrate;

forming a conductive film on the gate insulating film and on the element isolation insulating film;

forming a first opening in the conductive film of the first region;

patterning the conductive film of the second region to make the conductive film into a gate electrode;

forming a source/drain region in the semiconductor substrate beside the gate electrode;

forming an interlayer insulating film on each of the gate electrode and the conductive film as well as in the first opening;

forming a second opening with a size to encompass the first opening in the interlayer insulating film of the second region;

forming a hole in the element isolation insulating film under the first opening;

applying resist onto the interlayer insulating film, and in the first and the second openings as well as in the hole:

aligning the electron beam exposure apparatus with the semiconductor substrate under the state where the resist is applied, while using the first opening and the hole as an alignment mark, by scanning the mark with a electron beam of the electron beam exposure apparatus through the second opening and measuring an intensity of a reflected electron beam from the mark;

exposing the resist existing in a hole formation region of the first region with an electron beam using the electron beam exposure apparatus after carrying out the alignment;

developing the resist to make a resist pattern after the exposure; and forming in the interlayer insulating film a hole with a depth reaching the source/drain region by etching the interlayer insulating film by use of the resist pattern as a mask.

2. The method of manufacturing a semiconductor device according to claim 1, wherein the step of aligning is carried out by acquiring a graph showing a relationship between an amount of deflection of the electron beam and the intensity of the reflected electron, and by regarding a center of a valley of the graph as a center position of the alignment mark.

3. The method of manufacturing a semiconductor device according to claim 1, wherein a chip region of the semiconductor substrate is employed as the second region, and a region included in a scribe region of the semiconductor substrate is employed as the first region.

4. The method of manufacturing a semiconductor device according to claim 3, wherein the first region is provided in four corners of the outside of the chip region.

5. The method of manufacturing a semiconductor device according to claim 1, wherein a chip region of the semiconductor substrate is employed as the second region, and a region included in the chip region is employed as the first region.

6. The method of manufacturing a semiconductor device according to claim 5, wherein the plurality of first regions is provided in the one chip-region.

7. The method of manufacturing a semiconductor device according to claim 6, wherein the first region is provided in four corners of the second region and in a center thereof.

8. The method of manufacturing semiconductor devices according to claim 1, wherein the step of forming the element isolation insulating film includes a step of forming a groove in the semiconductor substrate and a step of forming an insulating film in the groove to make the insulating film into the element isolation insulating film.

9. The method of manufacturing a semiconductor device according to claim 1, the method further comprising:

a step of forming in the hole an conductive plug electrically connected to the source/drain region.

10. The method of manufacturing a semiconductor device according to claim 9, wherein, in the step of forming of the conductive plug, a conductive plug is formed in the hole as well as in the first and second openings.

* * * * *